United States Patent
Sato et al.

(10) Patent No.: US 7,230,592 B2
(45) Date of Patent: Jun. 12, 2007

(54) ORGANIC ELECTROLUMINESCENT LIGHT EMITTING DISPLAY DEVICE

(75) Inventors: Toshihiro Sato, Mobara (JP); Genshiro Kawachi, Chiba (JP); Yoshiro Mikami, Hitachiota (JP); Masaya Adachi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 333 days.

(21) Appl. No.: 10/376,331

(22) Filed: Mar. 3, 2003

(65) Prior Publication Data

US 2004/0017162 A1 Jan. 29, 2004

(30) Foreign Application Priority Data

Mar. 4, 2002 (JP) .............................. 2002-056733

(51) Int. Cl.
*G09G 3/30* (2006.01)
(52) U.S. Cl. ...................... 345/76; 313/498; 315/169.3
(58) Field of Classification Search ................. 345/76, 345/82, 204; 313/495, 498, 496, 499, 504; 315/169.3, 169.1
See application file for complete search history.

(56) References Cited

U.S. PATENT DOCUMENTS

| | | | | |
|---|---|---|---|---|
| 6,259,200 B1 * | 7/2001 | Morita et al. | ............... | 313/498 |
| 6,618,033 B2 * | 9/2003 | Takafuji | ....................... | 345/87 |
| 6,738,031 B2 * | 5/2004 | Young et al. | .................. | 345/76 |
| 6,809,357 B2 * | 10/2004 | Tsukamoto et al. | | |
| 6,940,476 B2 * | 9/2005 | Ko | ............................... | 345/76 |
| 6,958,740 B1 | 10/2005 | Nishikawa | | |
| 2001/0004190 A1 * | 6/2001 | Nishi et al. | .................. | 313/498 |
| 2001/0055008 A1 * | 12/2001 | Young et al. | ................ | 345/204 |
| 2002/0038998 A1 * | 4/2002 | Fujita et al. | ................. | 313/495 |

* cited by examiner

*Primary Examiner*—Regina Liang
(74) *Attorney, Agent, or Firm*—Reed Smith LLP; Stanley P. Fisher, Esq.; Juan Carlos A. Marquez, Esq.

(57) ABSTRACT

In an organic electroluminescent light emitting display device comprising a plurality of pixels each of which includes an organic electroluminescent element emitting light by a current supplied thereto, a plurality of active elements including a first active element which acquires a data signal and a second active element which regulates the current supplied to the organic electroluminescent element in accordance with the data signal, and a capacitive element storing the data signal, the present invention utilizes a part of the capacitive element arranged in one of the pixels for a light shielding member which shields the plurality of active elements arranged the one of the pixels from light emitted by the organic electroluminescent element arranged therein or another pixel adjacent thereto so as to suppress image quality deterioration and smear appearing in an image display area of the organic electroluminescent light emitting display device.

16 Claims, 17 Drawing Sheets

FIG. 5
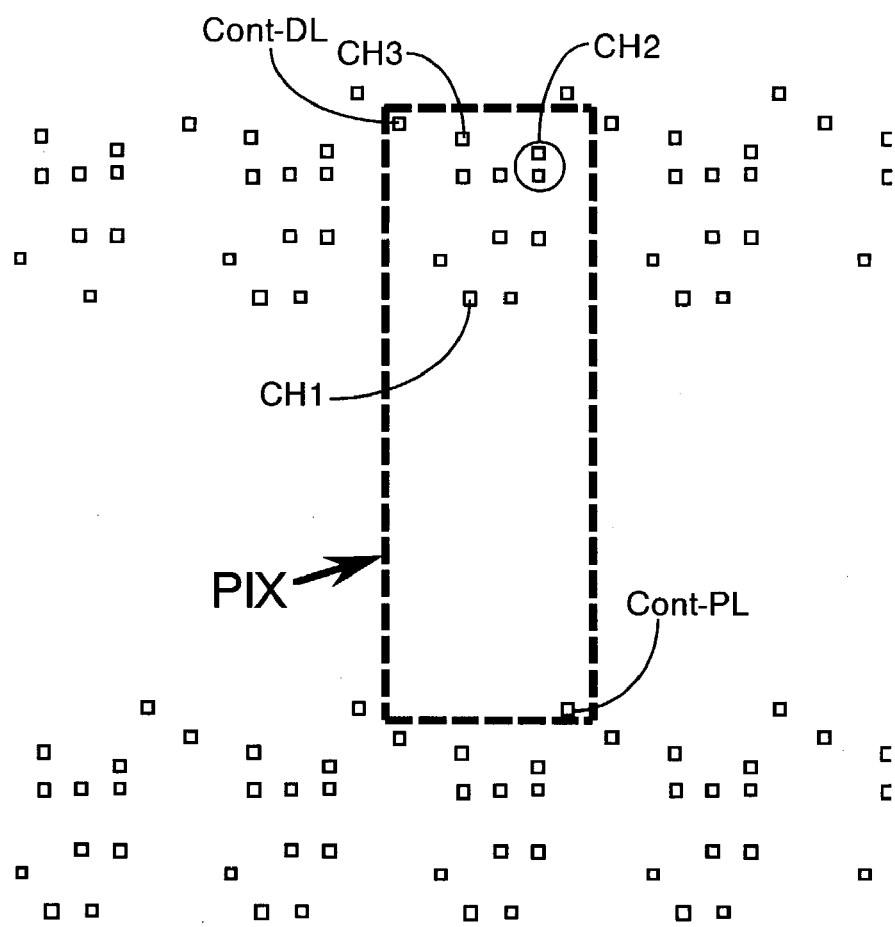
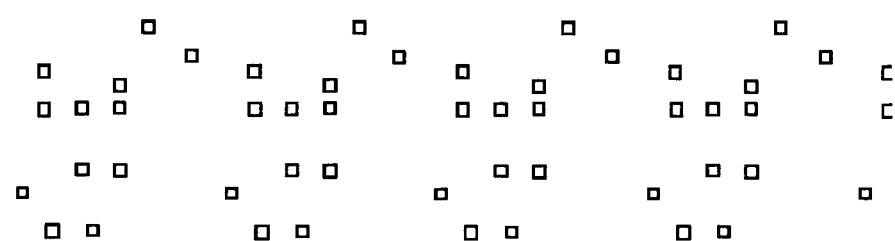

x: Distance between Tapered Edge of Bank and End Portion of Shielding Layer

FIG. 14
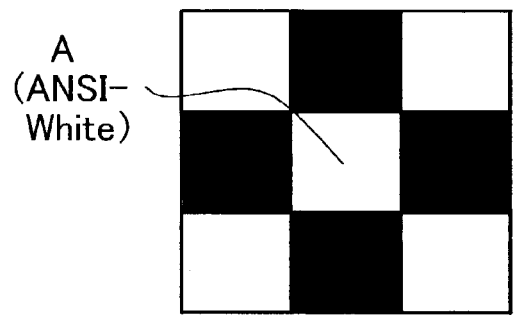
A (ANSI-White)
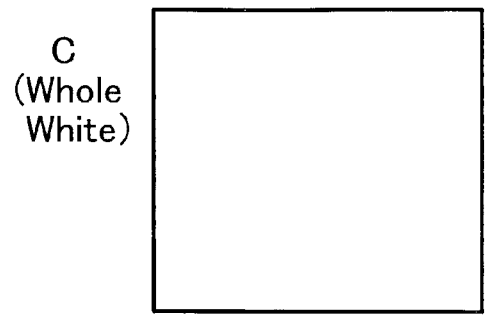
C (Whole White)
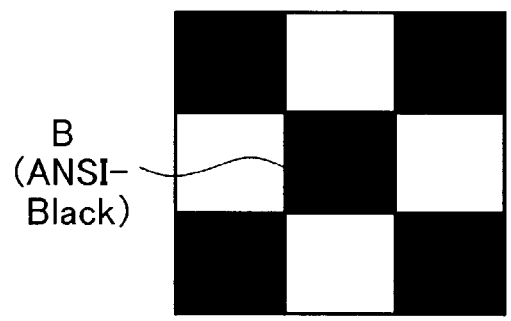
B (ANSI-Black)
D (Whole Black)

ORGANIC ELECTROLUMINESCENT LIGHT EMITTING DISPLAY DEVICE

BACKGROUND OF THE INVENTION

1. Field of the Invention

The present invention relates to an organic electroluminescent light emitting display device which provides a region formed of an organic materials which emit light by an electroluminescence phenomenon, and more particularly to a pixel structure suitable for an organic electroluminescent light emitting display device which displays an image by an active-matrix driving using a switching element formed on each pixel.

2. Description of the Related Art

Expectations are growing that an organic electroluminescent light emitting display device (hereinafter referred to as "organic EL light emitting display device) which is driven by an active matrix method (also referred to as TFT type) will become a flat panel display of next generation by replacing a liquid crystal display.

Conventional organic EL pixel constitutions and pixel circuits are disclosed in JP-A-11-329715, JP-T-11-503868, JP-T-11-503869 and U.S. Pat. No. 6,157,356. Further, U.S. Pat. No. 5,561,440 discloses a light shielding structure in a pixel of a display device driven by an active matrix method by taking a liquid crystal display device as an example.

SUMMARY OF THE INVENTION

While an organic EL light emitting display device has an advantage that a bright image display having high luminance can be performed, the organic EL light emitting display device has a problem that light emitted from a light emitting layer of an organic EL element formed on each pixel is irradiated to a semiconductor channel of a switching element formed on each pixel and modulates the charge holding characteristics (conductive state of the semiconductor channel) of the switching element. In the organic EL light emitting display device which is driven by the active matrix method, a switching element which has a semiconductor channel (hereinafter simply referred to as "channel") formed of a polycrystalline silicon film (also referred to as "Poly-Si") is provided to each pixel. However, the polycrystalline silicon film (Poly-Si) exhibits a large photoconductivity and hence, the apparent photoconduction is generated in a polycrystalline silicon film in accordance with an electric field applied thereto when light is irradiated thereto. Accordingly, with respect to the switching element (for example, thin film transistor) which includes the channel formed of the polycrystalline silicon film and controls a charge quantity penetrating the channel, even when the switching element is turned off, there arises a problem that a considerable quantity of charge passes through the channel (so-called OFF current). For example, when a white light having 2000 lux (unit:lx) is irradiated to such a thin film transistor (also referred to as "TFT") in a turn-off state, the OFF current which is generated in the thin film transistor is sharply increased.

In a display device which includes an image display region on which a plurality of pixels provided with switching elements (for example, the above-mentioned TFTs) are formed and performs image display by driving a plurality of these pixels in an active matrix method (also referred to as "TFT method"), when the above-mentioned OFF current is generated in at least one of these switching elements, the image quality of the display image is degraded. With respect to an organic EL light emitting display device in which an organic EL element is provided to each pixel, a light emitting portion which is included in the organic EL element is arranged close to the switching element which drives or controls the organic EL element and hence, the switching element is exposed to light having a several hundred thousands lux. Accordingly, even when a conventional light shielding structure used in the pixel region of the liquid crystal display device driven by an active matrix method (hereinafter referred to as "TFT type liquid crystal display device") is applied as a corresponding light shielding structure of the organic EL light emitting display device, it is impossible to shield the pixel region from such a strong light. Particularly, a bottom emission-type organic EL light emitting display device which irradiates light from the organic EL element to a TFT substrate having a main surface on which switching elements are formed, the degradation of image quality of the display image is liable to easily occur due to such a strong light.

It is considered that the above-mentioned unexpected problem which occurs due to the light emitted from the organic EL element (hereinafter also referred to as "leaking of light") is caused by a fact that light which is generated in a certain pixel penetrates an insulation film (so-called bank layer) which separates light emitting regions (organic material layers) of the organic EL light emitting display device among pixels and is leaked to neighboring other pixel. Such leaking of light is perceived as smear or contrast unevenness by a user of the organic EL light emitting display device.

From a viewpoint of contrast of an image displayed on the organic EL light emitting display device, it is very important to increase the blackness of the pixel in a non-light-emitting state. In the organic EL light emitting display device, an influence that the leaking of light attributed to reflection of light in the substrate or the like gives to the black display is larger than the corresponding influence in the liquid crystal display device. Accordingly, the high luminance of the pixel in the white display state is also cancelled by the leaking of light which is generated when the pixel is in the black display state and hence, the contrast of the display image is still held at a low level. As a result, the image quality of the display image inevitably becomes inferior to the image quality of the display image of the liquid crystal display device.

Further, with respect to the organic EL light emitting display device, the enlargement of the light emitting region in each pixel is also important. In manufacturing steps of the organic EL light emitting display device, when an organic electroluminescent material of i.e. polymeric series is supplied to each pixel in a solution state, it is necessary to form an opening having a depth which is sufficient for temporarily storing the solution made of the organic EL material in the above-mentioned bank. Accordingly, with respect to the bottom emission-type organic EL light emitting display device which irradiates light to the TFT substrate side, the reduction of the light emitting region caused by narrowing the opening on the bank at the TFT substrate side must be taken into account. Accordingly, a region which is allocated to the formation of the opening on an upper surface of the bank cannot be made extremely small. On the other hand, a pixel circuit which controls the organic EL element formed on the pixel is also formed on each pixel. Accordingly, it is necessary to ensure a region which is served for a switching element and a capacitance element included in the pixel circuit at each pixel. Under such circumstances, it is necessary to skillfully arrange the above-mentioned two regions on a plane inside each pixel.

On the other hand, another kind of organic EL material having molecular weight thereof lower than that of the above-mentioned organic EL material of the polymeric series is also able to be utilized for forming the organic EL element. The another kind of organic EL material is also called as an organic EL material with low molecular weight because the molecular weight thereof is so low that this kind of organic EL material can be supplied to each pixel (having the organic EL element) in a sublimed state. Therefore, an application of the organic EL material with low molecular weight to forming the pixel permits an opening in the above-mentioned bank to be formed shallower than that for the organic EL material of the polymeric series. However, also in the organic EL light emitting display device having organic EL elements made of organic EL material with low molecular weight, it is necessary to arrange the light emitting region and the pixel circuit region on a plane at each pixel as described above.

The present invention has been made to solve the above-mentioned drawbacks under such circumstances. As typical constitutions of the organic EL light emitting display device to which the present invention is applied, followings are considered.

(1) A first example of an organic electroluminescent light emitting display device according to the present invention comprises a substrate having a principal surface, a plurality of pixels arranged two-dimensionally on the principal surface of the substrate, a plurality of scanning signal lines juxtaposed along a first direction on the principal surface of the substrate, a plurality of data signal lines juxtaposed along a second direction transverse to the first direction on the principal surface of the substrate, and a plurality of current supply lines arranged on the principal surface of the substrate. Each of the plurality of pixels has a plurality of active elements including a first active element which acquires a data signal transmitted by one of the plurality of data signal lines in response to a voltage signal of one of the plurality of scanning signal lines and a second active element which regulates a current supplied from one of the plurality of current supply lines in accordance with the data signal, a data storing element storing the data signal acquired by the first active element, and an organic electroluminescent element emitting light by the current which is regulated by the second active element and supplied to organic electroluminescent element. At least one of the plurality of pixels includes a light shielding member which shields the plurality of active elements arranged therein or in another of the plurality of pixels adjacent thereto from light emitted by the organic electroluminescent element arranged therein.

(2) A second example of the organic electroluminescent light emitting display device according to the present invention comprises a substrate having a principal surface, a plurality of scanning signal lines juxtaposed along a first direction on the principal surface of the substrate, a plurality of data signal lines juxtaposed along a second direction transverse to the first direction on the principal surface of the substrate, a plurality of current supply lines arranged on the principal surface of the substrate, and a plurality of pixels arranged two-dimensionally on the principal surface of the substrate. Each of the plurality of pixels has a plurality of active elements including a first active element which acquires a data signal transmitted by one of the plurality of data signal lines in response to a voltage signal of one of the plurality of scanning signal lines and a second active element which regulates a current supplied from one of the plurality of current supply lines in accordance with the data signal, a data storing element storing the data signal acquired by the first active element, and an organic electroluminescent element emitting light by the current which is regulated by the second active element and supplied to organic electroluminescent element. Moreover, the second example of the organic electroluminescent light emitting display device also comprises a first light shielding member arranged at a position where the first light shielding member obstructs light from the organic electroluminescent element arranged the one of the plurality of pixels to the plurality of active elements arranged at the pixel or another of the plurality of pixels adjacent to the one of the plurality of pixels, and a second light shielding member arranged at a boundary between a pair of the plurality of pixels adjacent to one another and blocking off optical leakage between the pair of the plurality of pixels at the boundary.

Switching elements like thin film transistors each of which has a channel layer formed of a poly-crystal or a pseudo-single crystal of a semiconductor material are provided for instance as the plurality of active elements of each of the aforementioned first and second examples of the organic electroluminescent light emitting display device according to the present invention. An example of the organic electroluminescent element provided for each of the first and second examples of the organic electroluminescent light emitting display device includes a transparent electrode receiving the current supplied from the second active element, an insulating film (called "Bank", also) formed on the transparent electrode and having an opening which exposes a part of an upper surface of the transparent electrode, and an organic material layer formed on the part of the upper surface of the transparent electrode. The insulating film is formed e.g. of a dark-colored material (a black-colored material), or an inorganic material. The insulating film may be formed of a material of poly-imide series, also. Moreover, the opening of the insulating film may be formed to be tapered toward the upper surface of the transparent electrode in its cross section.

More concrete constitutional examples of the aforementioned first example of the organic electroluminescent light emitting display device according to the present invention will be described as follows, respectively.

(1a) When the organic electroluminescent element includes a transparent electrode receiving the current supplied from the second active element, an insulating film formed on the transparent electrode and having an opening which exposes a part of an upper surface of the transparent electrode, and an organic material layer covering the opening of the insulating film and a part of the insulating film along the opening thereof to which the current is supplied through the part of the upper surface of the transparent electrode, a boundary formed between the part of the insulating film and the organic material layer is covered by the light shielding member in a plan view from the principal surface of the substrate.

(1b) At least one of the conductive layers formed as a part of the scanning signal line and one of electrodes of the data storing element is provided for the light shielding member.

(1c) The light shielding member is provided with a conductive layer formed at the same level as that of the scanning signal line on the principal surface of the substrate and is shaped into a ring, a L, or an U in the vicinity of a light emitting region of the organic electroluminescent element in a plan view from the principal surface of the substrate.

(1d) The light shielding member is a part of a wiring layer formed at the same level as that of at least one of the data signal line and the current supply line on the principal surface of the substrate and supplying the current to the organic electroluminescent element, and is electrically connected e.g. to the transparent electrode of the organic electroluminescent element which receives the current supplied from the second active element.

(1e) The light shielding member contains an aluminum layer therein.

(1f) The light shielding member is arranged in each of the plurality of pixels, and the plurality of active elements and the organic electroluminescent element are spaced apart from each other along the principle surface of the substrate by the light shielding member in each of the plurality of pixels.

More concrete constitutional examples of the aforementioned second example of the organic electroluminescent light emitting display device according to the present invention will be described as follows, respectively.

(2a) When the organic electroluminescent element includes a transparent electrode receiving the current supplied from the second active element, an insulating film formed on the transparent electrode and having an opening which exposes a part of an upper surface of the transparent electrode, and an organic material layer covering the opening of the insulating film and a part of the insulating film along the opening thereof to which the current is supplied through the part of the upper surface of the transparent electrode, (2a-1) the first light shielding member and the second light shielding member are arranged in each of the plurality of pixels and formed between the principal surface of the substrate and the transparent electrode, and (2a-2) at least one of the first light shielding member and the second light shielding member is extended from a lower side of insulating to a lower side of the opening of the insulating film.

(2b) At least one of conductive layers formed as a part of the scanning signal line and one of electrodes of the data storing element is shaped into the first light shielding member, and the second light shielding member is at least one of a conductive layer formed as the one of electrodes of the data storing element and a conductive layer connected to the current supply line.

(2c) One of the first light shielding member and the second light shielding member is a part of the scanning signal line, and another thereof is a conductive layer formed at the same level as that of the scanning signal line on the principal surface of the substrate which is shaped into a ring, a L, or an U in the vicinity of a light emitting region of the organic electroluminescent element in a plan view from the principal surface of the substrate.

(2d) At least one of the first light shielding member and the second light shielding member is (2d-1) a part of at least one of the data signal line and the current supply line, or (2d-2) a part of a wiring layer formed at a level on the principal surface of the substrate where at least one of the data signal line and the current supply line is formed and supplying the current to the organic electroluminescent element (e.g. electrically connected to the transparent electrode of the organic electroluminescent element which receives the current supplied from the second active element).

(2e) The first light shielding member and the second light shielding member contain aluminum layers therein, respectively.

(2f) Each of the plurality of pixels is divided into a region where the plurality of active elements are formed and another region where the organic electroluminescent element is formed along the principle surface of the substrate.

Here, the present invention is not limited to the organic EL light emitting display device having the above-mentioned structures and various modifications can be made without departing from the technical concept of the present invention.

BRIEF DESCRIPTION OF THE DRAWINGS

FIG. 1(A) and FIG. 1(B) show one example of a pixel provided to an organic EL light emitting display device according to the present invention, wherein FIG. 1(A) shows a planar structure and FIG. 1(B) shows an equivalent circuit thereof;

FIG. 5 shows a third photo pattern formed on a photolithography mask used in the step for manufacturing the pixel array shown in FIG. 2;

FIG. 10(a) to FIG. 10(c) show a cross-sectional structure of one pixel (pixel region PIX) out of a plurality of pixels arranged in the pixel array shown in FIG. 2, wherein FIG. 10(a) shows a cross-section of a portion taken along a dashed line A—A of the pixel region PIX shown in FIG. 2, FIG. 10(b) shows a cross-section of a portion taken along a dashed line B—B of the pixel region PIX shown in FIG. 2 and FIG. 10(c) shows a cross-section of a portion taken along a dashed line C—C of the pixel region PIX shown in FIG. 2;

FIG. 11(a) and FIG. 11(b) are views which schematically show the positional relationship between a bank end portion and a shield end portion shown in FIG. 10(a) to FIG. 10(c), wherein FIG. 11(a) shows a cross section of a bank which is formed such that the bank is projected from the shield end portion and FIG. 11(b) shows a cross section of a bank which is formed such that the bank end portion remains on an upper portion of the shield;

FIG. 14 shows patterns (images) generated on a display screen in an experiment in which a contrast ratio between the organic EL light emitting display device according to the present invention and the conventional organic EL light emitting display device are compared;

DETAILED DESCRIPTION

EMBODIMENTS OF THE INVENTION

Figure 1A:
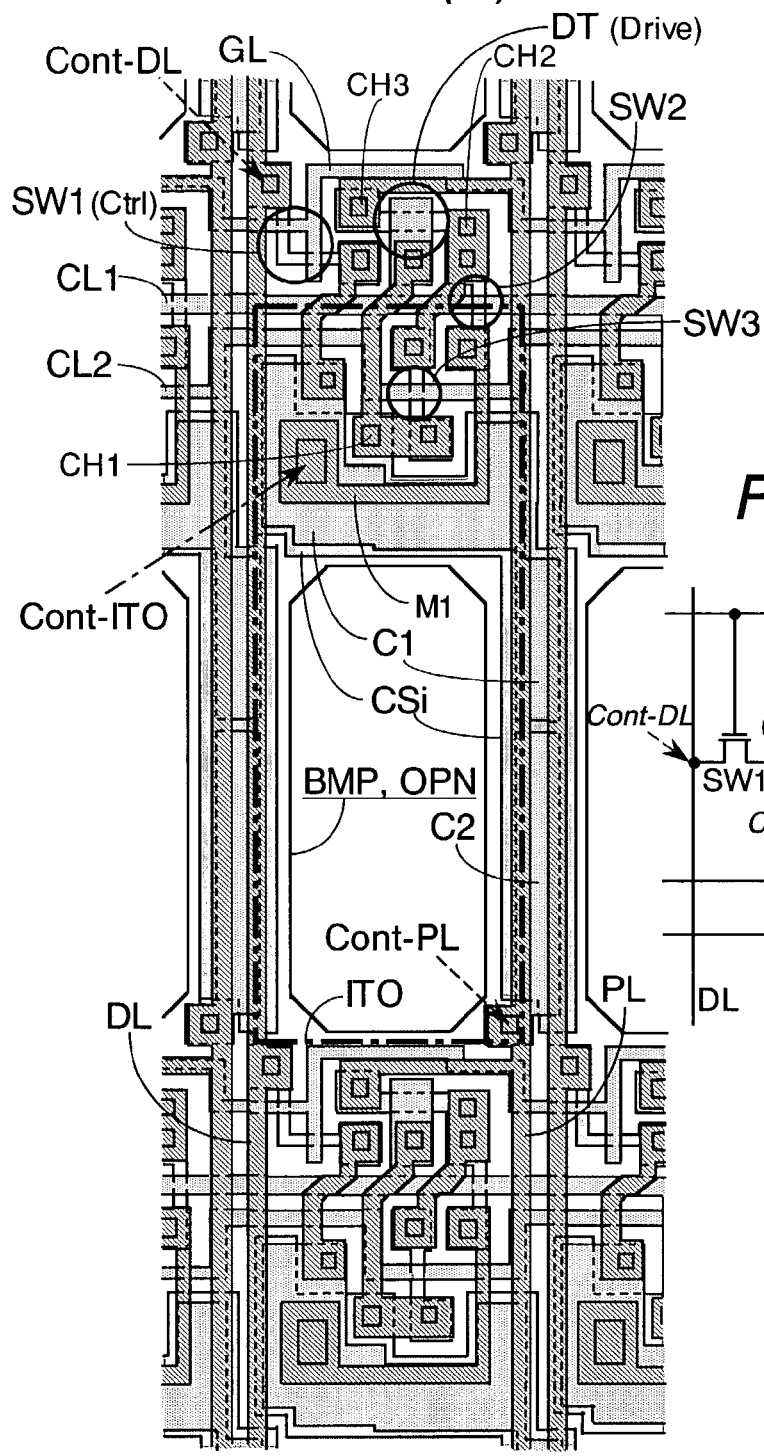
Figure 1B:
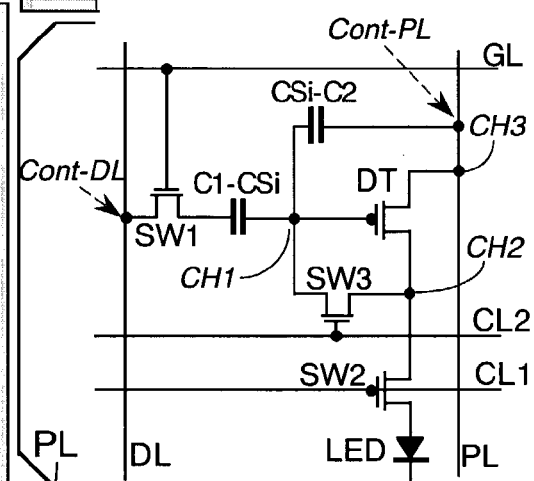

FIG. 1(A) is a plan view showing one pixel in one example of an organic EL light emitting display device (also referred to as "organic EL display device") to which the present invention is applied. FIG. 1(B) shows an equivalent circuit of this pixel (pixel element), wherein switching elements SW1, SW2, SW3, DT, capacitive elements C1-CSi, CSi-C2, and contact holes (indicated by double square shape in FIG. 1(A)) which will he explained later Cont-DL, Cont-PL, and nodes formed as CH1, CH2, CH3 shown in FIG. 1(A) are indicated in FIG. 1(B) in a corresponding manner. Respective capacitive elements are specified by reference characters each of which is indicated by a couple consisting of a semiconductor layer CSi which is formed as a pair of electrodes which sandwich an insulation material layer (dielectric layer) therebetween and a conductive layer C1 or C2 which is placed over the semiconductor layer CSi. Although an organic EL element (light emitting element) LED which is formed for each pixel is also included in this equivalent circuit, the full configuration of the organic EL element LED is not described in FIG. 1(A). In FIG. 1(A), the organic EL element LED is constituted of a transparent electrode ITO (profile thereof being indicated by a dashed line) and an organic material layer and an electrode layer (neither of them being shown in FIG. 1(A)) which are sequentially laminated to the upper surface of the transparent electrode ITO.

Figure 2:
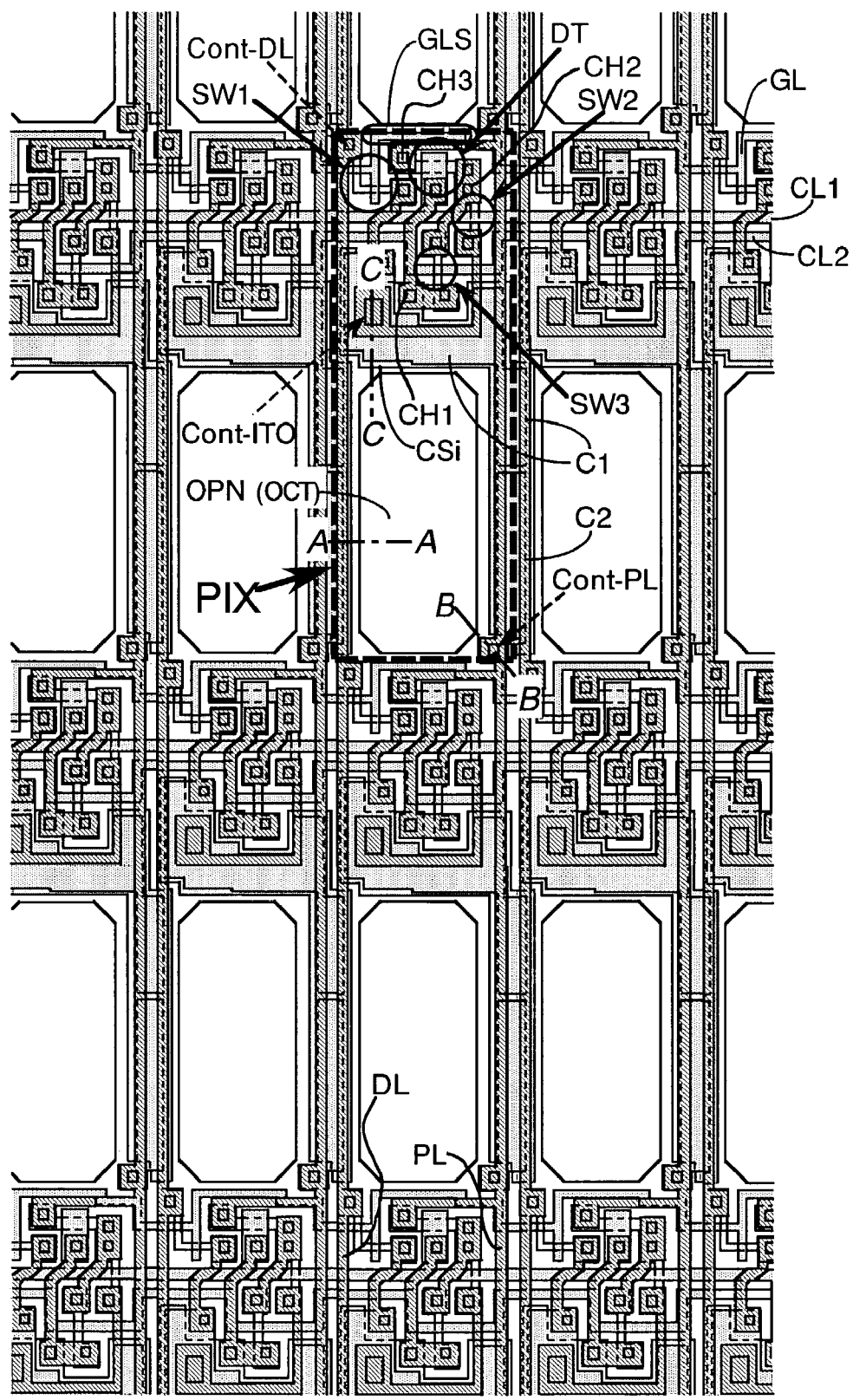
FIG. 2 is a plan view of a pixel array in which a plurality of pixels shown in FIG. 1(A) are arranged in a matrix array.

In the image display region of the organic EL light emitting display device according to the present invention, a plurality of pixels shown in FIG. 1 are arranged two-dimensionally as shown in FIG. 2 thus forming a so-called active matrix type pixel array. Respective members (semiconductor layer CSi and electrode layers C1, C2) which are included in the equivalent circuit corresponding to one pixel shown in FIG. 1(B) are substantially surrounded by a frame indicated by a broken line which corresponds to the pixel region PIX shown in FIG. 2.

In FIG. 1(A), an octagonal profile indicated by the reference character OPN shows an opening portion of a bank BMP. The bank BMP is an insulation layer formed on a periphery of an upper surface of the transparent electrode ITO. The above-mentioned organic material layer (explained later as member OCT) is brought into contact with the upper surface of the transparent electrode ITO exposed through the opening. The bank BMP electrically separates among pixels the organic material layers formed on the transparent electrodes ITO and the openings OPN are substantially aligned with light emitting regions of the organic EL element LED (see FIG. 1(B)) formed on respective pixels.

On the other hand, in this embodiment, the above-mentioned electrode layer (referred to as "member CM" later) which constitutes the organic EL element LED by sandwiching the organic material layer together with the transparent electrode ITO strides over a plurality of pixels and are formed like counter electrodes (common electrodes) in a twisted nematic-type (so-called TN-type) liquid crystal display device. To the organic EL element LED which is indicated as the opening OPN of the bank BPM in FIG. 1(A), an electric current (charge) which passes a current path which is formed by sequentially arranging the node CH3, the switching element DT, the node CH2, the switching element SW2 from a branch line of a current supply line PL is supplied through the transparent electrode ITO which is electrically connected to the current path through the contact hole Cont-ITO. In respective switching element DT and switching element SW2 (surrounded by circles in FIG. 1(A)), the current path is formed as semiconductor layers (indicated by thick color) and electrode layers (indicated by thin color) made of metal or alloy are formed by way of insulation layers. In other words, the flow of charge in the above-mentioned current path is controlled by the switching element DT and the switching element SW2 formed on the current path (electric fields applied to semiconductor layers corresponding to these switching elements). For example, the charge in the current path which passes the switching element SW2 is controlled by the electric field applied to the control signal line CL1.

The supply of current to the organic EL element LED in each pixel of this embodiment shown in FIG. 1(A) and FIG. 1(B) is controlled in response to video signals (voltage signals) supplied from the drain line (video signal line) DL for each pixel. In other words, to the organic EL element LED, an electric current which corresponds to the video signal transmitted through the drain line DL is applied. The switching element SW1 is also referred to as a control transistor. Inside the circle which indicates such a region, a scanning signal line GL is formed such that the scanning signal line GL strides twice over the semiconductor layer electrically connected to the drain line DL through the node Cont-DL. The gate electrode (here, scanning signal line GL) which crosses twice the channel layer (semiconductor layer) like the switching element SW1 shown in FIG. 1(A) is also referred to as dual gates. The video signal outputted from the switching element SW1 reaches the conductive layer C1 which constitutes one of a pair of electrodes forming the capacitive element C1-CSi through a conductive layer which strides over two control signal lines CL1 and CL2. Accordingly, to each pixel which belongs to each row of pixels (a group of pixels arranged in the direction which crosses the extending direction of the drain line) arranged parallel along the drain line, the video signal is inputted from the drain line DL in response to the scanning signal transmitted through the scanning signal line GL corresponding to the row of pixels, wherein the voltage is held in the capacitive element C1-CSi until the next video signal is inputted to each pixel. The capacitive element C1-CSi functions like a capacitance constituted of a pair of electrodes which sandwich the liquid crystal layer in the TN-type liquid crystal display device.

On the other hand, the luminance of the organic EL element LED is controlled by the switching element DT formed on the current path which supplies the electric current to the organic EL element LED. Accordingly, the switching element DT is also referred to as "drive transistor". As shown in FIG. 1(A) and FIG. 1(B), in this embodiment, in the circle which indicates the switching element DT, a conductive layer which is electrically connected to another semiconductor layer CSi of a pair of electrodes which form the capacitive element C1-CSi at the node CH1 is formed on an upper portion of the semiconductor layer of the above-mentioned current path. Accordingly, in response to the video signal inputted from the drain line DL, the electric current which responds to the voltage held in the capacitive element C1-CSi is written in the light emitting region (corresponding to the above-mentioned opening OPN of the bank) of the organic EL element through the switching element DT.

Here, the scanning signal line GL is formed in a zigzag shape to obviate the contact holes (indicated by a double square shape in FIG. 1(A)) which constitute the above-mentioned node Cont-DL or the like. However, in the image display region as a whole, as exemplified in FIG. 2, the scanning signal line GL extends in the direction which crosses the extending direction of the current supply line PL. In the pixel, the scanning signal line GL extends along the light emitting region (opening OPN) of a pixel (upper side in FIG. 1(A)) which is arranged close to the pixel and is overlapped to the branch line of the above-mentioned current supply line PL. The scanning signal line GL formed in the above-mentioned manner lies over (next pixel side) respective channel layers (semiconductor layers indicated in thick color) of the above-mentioned switching elements SW1, SW2, SW3, DT formed in the pixel. Accordingly, by forming the scanning signal line GL using a material such as metal, alloy or the like which can easily absorb or reflect light, it is possible to conceal these channel layers from light which is generated at other pixel (upper neighboring pixel in FIG. 1(A)) arranged adjacent to and along the drain line DL or the current supply line PL. Particularly, when the branch line of the current supply line PL is formed of a material which easily absorbs or reflects light, a portion of the scanning signal line GL which is overlapped to the branch line efficiently performs light-shielding of the above-mentioned respective channel layers (portion of the scanning signal line GL being surrounded by a circle which indicates a light shielding layer GLS in FIG. 2). Such a scanning signal line GL constitutes one of features of the light shielding structure according to the present invention. The above-mentioned light shielding structure may be formed by the control signal lines CL1, CL2 extending in the direction which crosses the extending direction of the drain line DL and the current supply line PL in place of the scanning signal line GL.

Figure 18:
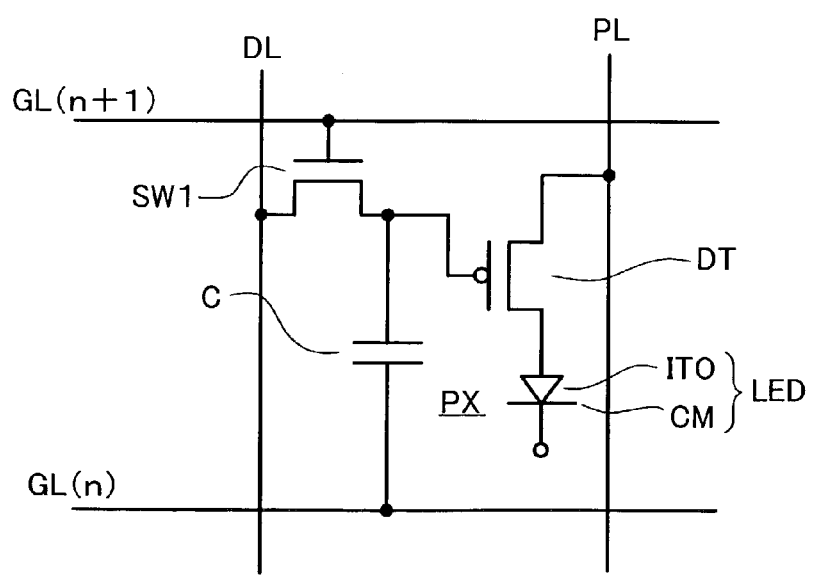
FIG. 18 is a view showing an equivalent circuit of one of pixels included in a pixel array shown in FIG. 17.

As shown in FIG. 1(A) and FIG. 1(B), in each pixel expressed by this embodiment, two control signal lines CL1, CL2 and the switching elements SW2, Sw3 which are controlled by either of the control signal lines CL1, CL2 are provided. In a so-called current-driven type organic EL light emitting display device which controls the luminance in response to a current supply quantity to the organic EL element LED, the arrangement of these control signal lines CL1, CL2 and switching elements SW2, SW3 is not always necessary in view of the operational principle. For example, with respect to an organic EL light emitting display device shown in FIG. 17 and a pixel structure thereof shown in FIG. 18, they are not provided with these control signal lines and switching elements. So long as there is no irregularities with respect to the characteristics (particularly "threshold voltage value") of the drive transistors arranged in respective pixels or such irregularities can be ignored, it is possible to practically use the organic EL light emitting display device having the pixel structure shown in FIG. 18. Moreover, the organic EL light emitting display device having the pixel structure of FIG. 18 can be also used practically by modulating brightness of each pixel thereof while a voltage applied to the channel of the drive transistor DT in FIG. 18 is swung in a range in which the drive transistor DT responds linearly to the voltage. However, when the channel layers of the drive transistors DT are formed of polycrystal or pseudo-single crystal of semiconductor material such as silicon, it is difficult to deny that the conditions for crystallizing process (for example, annealing by laser irradiation) differ between pixels. The difference in the conditions for crystallizing process allows the coexistence of the pixels which differ in the characteristics of the drive transistors DT within the image display region of one organic EL light emitting display device. As a result, it gives rise to the irregularities of luminance (luminance irregularities) within the image display region of the organic EL light emitting display device to which the image data for displaying the whole screen with the same gray scale is inputted.

According to this embodiment, one of reasons why two control signal lines CL1, CL2 and the switching elements SW2, SW3 which are controlled by either of the control signals CL1, CL2 are provided is to make the characteristics of the drive transistors DT which become non-uniform within the image display region substantially uniform. These functions are explained as follows. To the control signal lines CL1 and CL2, control signals which differ in respective timing are supplied from a control signal supply circuit not shown in FIG. 1(A) and FIG. 1(B).

To be more specific, first of all, the control signals transmitted through the control signal line CL1 turn on the switching element (first input switch) SW2. Here, although the drive transistor DT is not turned on, the node CH2 side of the drive transistor DT is connected to the reference potential through the organic EL element LED from the floating state and the potential is raised to a given value. Subsequently, the control signal transmitted through the control signal line CL2 turns on the switching element (second input switch) SW3 which corresponds to the control signal. Due to such a constitution, one electrode CSi of the capacitive element CSi-CS2 which was in the floating state is connected to the node CH2 side of the drive transistor DT through the switching element SW3 and the potential is raised to the above-mentioned given value. Here, since the gate potential (potential of the node CH1) of the drive transistor DT is equal to the output-side potential (potential on the node CH2 side), the channel layer of the drive transistor DT interrupts the flow of charge. Since a given electric current flows in the current supply line PL irrespective of the video signal transmitted through the drain line DL, the potential of the current supply line is also substantially fixed. Accordingly, by sequentially turning on two switching elements SW2, SW3 (by sequentially bringing respective channel layers into a conductive state), a substantially same quantity of charge is stored in the capacitive element CSi-C2 of any pixel. When the channel layer of the switching element SW3 is closed in this state and the switching element (control transistor) SW1 is turned on subsequently, in response to the voltage (video signal) applied to one electrode C1 of the capacitive element C1-CSi, the capacity of the capacitive element C1-CSi is also changed. In response to this change of capacity, there arises a difference between the potential of the node CH1 (gate potential of the drive transistor DT) and the potential on the output side(node CH2 side). Due to this potential difference, in the pixel described in this embodiment, by turning on the drive transistor DT and by controlling a quantity of charge which flows in the turned-on channel, the organic EL element LED is lit with given luminance.

Although the channel layer of the drive transistor DT is usually turned on with respect to a given gate potential (threshold voltage) Vth, when the channel layer is formed of a polycrystalline layer or a pseudo single crystal layer of semiconductor material, for example, as mentioned above, the threshold voltage Vth differs corresponding to respective pixels. In this embodiment, an operating point of the drive transistor DT which is dependent on such a threshold voltage Vth is set using the potential of the node CH1 given by the capacitive element CSi-C2 as the reference, and the ON-OFF of the drive transistor DT is controlled based on the balance of capacity between the capacitive element CSi-C2 and the capacitive element C1-CSi so as to stabilize the threshold voltage Vth whereby the irregularities of the threshold value Vth which are generated among the pixels is corrected. The detail of the respective operations of the switching elements SW1, SW2, SW3 and DT is explained hereinafter.

The switching element SW1 which is also referred to as the control transistor is a switch which inputs the video signal voltage to every pixel. This switching element SW1 is provided not only to this embodiment but also to a pixel of an organic EL light emitting display device which controls the conductive state of a channel layer of a drive transistor DT using the threshold voltage Vth. The switching element SW1 is turned on or off in response to the scanning signal transmitted through the scanning signal line GL which crosses the channel layer (semiconductor layer)of the switching element SW1, and writes in the video signal voltage inputted from the drain line DL to a capacitive element (capacitor) of a so-called pixel circuit provided to every pixel.

In writing in the image data to the image display region of the organic EL light emitting display device which drives the organic EL element provided to each pixel by current injection one time for every frame (vertical scanning period), for example, a period in which the switching element SW1 formed in each pixel is turned on is limited to a horizontal scanning period allocated to every scanning signal line GL. Accordingly, a current injection quantity (charge injection quantity) to the organic EL elements included in the pixel line which corresponds to each scanning signal line GL is also restricted.

In such a current driving type organic EL light emitting display device, different from a voltage driving type display device such as a TN type liquid crystal display device, it is difficult to maintain the luminance of the pixel for a given period at the switching element SW1 which acquires the image data (video signal). Accordingly, as mentioned above, another switching element which is also referred to as the drive transistor DT and a current supply line PL are provided to every pixel so as to maintain the conductive state of the channel layer for a given period whereby the luminance of each pixel is ensured. The capacitive element which is connected to the output side of the switching element (control transistor) SW1 holds the gate potential of the above mentioned drive transistor DT at a desired value for a given period and continues the current injection to the organic EL element LED. Accordingly, in both of the case in which the conductive state of the drive transistor DT is controlled using the threshold voltage Vth as the reference and the case in which the drive transistor DT is controlled in accordance with this embodiment, it is recommendable to provide the capacitive element to the output side of the switching element SW1.

In the switching element SW1 of this embodiment, as shown in FIG. 1(A), the channel layer has a dual gate structure which crosses the above mentioned scanning signal line GL at two portions thereof. Due to the control performed at these two portions, the operation to write in the signal voltage supplied from the drain line DL to one electrode C1 of the capacitive element C1-CSi is stabilized. Further, due to this dual gate structure, leaking of charge stored in the electrode (conductive layer C1 in this embodiment) on the switching element SW1 side (drain line DL side) of the capacitive element can be suppressed whereby the gate potential of the drive transistor DT is stabilized for a given period.

The switching element SW2 not only controls the storage of charge to one electrode (semiconductor layer) CSi of the above mentioned capacitive element CSi-C2 but also functions as a current supply switch for the flow of current from the drive transistor DT to the organic EL element ELD. The latter function is to write the current which is supplied from the current supply line PL and is adjusted in response to the video signal inputted from the drain line at the drive transistor DT to the organic EL element LED when the switching element SW2 is turned on. This latter function is used not only in this embodiment but also in the case in which the conductive state of the drive transistor DT is controlled using the threshold voltage Vth as the reference. Such a switching element (current supply switch SW2) is subjected to the ON-OFF control at the timing of the control signal line CL1.

The switching element SW3 is a switch controlling to make the capacitor (condenser) memorize the threshold voltage Vth of the drive transistor DT and constitutes a switching element peculiar to the pixel circuit of this embodiment shown in FIG. 1(B).

As shown in FIG. 1(A), in the drive transistor DT, the conductive layer which covers the channel layer (semiconductor layer) has a relatively large gate length which is elongated along the extending direction of the channel layer compared to other switching elements SW1, SW2 and SW3. The drive transistor DT of this embodiment is turned on based on the balance between the charge stored in the capacitive element CSi-C2 through the above mentioned switching element (timing switch) SW3 and the charge stored in the capacitive element C1-CSi through the above mentioned switching element (control transistor) SW1. Due to such a constitution, an electric current corresponding to the video signal supplied from the drain line DL passes the contact hole CH3 formed in the branch line of the electric supply line PL, and flows to a position arranged in front of the above mentioned switching element (current supply switch) SW2. Further, when the current supply switch SW2 is turned on, the electric current of the current supply line PL is written in the organic EL element LED.

FIG. 2 is a plan view in which the above mentioned pixels in FIG. 1(A) are arranged in a matrix array. One pixel shown in FIG. 1(A) corresponds to the pixel region PIX surrounded by a bold broken line in FIG. 2. The organic EL light emitting display device according to the present invention is provided with the image display region having the active matrix structure in which the pixels shown in FIG. 1(A) are arranged two-dimensionally as shown in FIG. 2.

One electrodes (semiconductor layers) CSi which are respectively provided to the capacitive elements (capacitors) C1, CSi, CSi-C2 included in the equivalent circuit of one pixel shown in FIG. 1(B) are described as regions of thick color which extend from the upper side to the right side of the bank opening OPN (light emitting region provided with organic material layer OCT) of the pixel region PIX shown in FIG. 2. Another electrode C1 of the capacitive element C1-CSi also extends from the upper side to the right side of the bank opening OPN and is formed over the above mentioned semiconductor layer CSi by way of an insulation material layer (dielectric layer). Another electrode C2 of the capacitive element CSi-C2 is formed above the semiconductor layer CSi which extends toward the right lower side of the bank opening OPN by way of an insulation material layer(dielectric layer) and is electrically connected to the current supply line PL formed above and at the contact hole Cont-PL formed at the right lower corner of the pixel region.

To the semiconductor layers CSi which constitute the above-mentioned one electrodes respectively at the capacitive elements C1-CSi, CSi-C2, the charge is supplied through the switching elements SW2, SW3. To another electrode C1 (indicated by color thinner than color of semiconductor layer CSi) of the capacitive element C1-CSi, the charges are supplied from the drain line DL formed on the left end of the pixel region PIX through the contact hole Cont-DL and the switching element SW1. To another electrode C2 (indicated by color thinner than color of semiconductor layer CSi) of the capacitive element CSi-C2, the charge is supplied from the current supply line PL formed on the right end of the pixel region PIX through the contact hole Cont-PL.

To describe in a strict sense, respective portions of the semiconductor layer CSi and the conductive layers C1, C2 which correspond to the pixel regions PIX shown in FIG. 2 are projected outwardly from the right end of the frame of a broken bold line indicating the pixel region PIX, while respective portions of the semiconductor layer CSi and the conductive layers C1, C2 which correspond to pixel regions arranged on the left side of the pixel region PIX enter the inside of pixel region PIX from the left end of a frame of a bold broken line which indicates the pixel region PIX.

As described above, in the organic EL light emitting display device shown in this embodiment, the charges which are stored respectively in the semiconductor layer CSi and the conductive layers C1, C2 which constitute two capacitive elements (capacitors) formed corresponding to the pixel region PIX determine a current quantity which is written in the light emitting regions (organic material layer OCT formed in the bank opening OPN) of the organic EL element from the branch line of the current supply line PL which extends to the upper end of the pixel region PIX through the contact hole CH3, the switching element DT which constitutes the drive transistor and the contact hole Cont-ITO. Here, in the pixel region PIX in FIG. 2, the transparent electrode layer ITO shown in FIG. 1(A) is omitted.

In the organic EL light emitting display device according to this embodiment, as the switching elements SW1, SW2, SW3 and the drive transistor DT which are provided for every pixel, a field effect type transistor (also referred to as "thin film transistor" or Poly-SiTFT) having a channel layer formed of poly-crystalline silicon (also referred to as Poly-Si) is used. In the display device which drives a plurality of pixels arranged in the image display region respectively using the switching elements of this type (Poly-SiTFT), due to a photovoltaic effect which appears when light is irradiated to the channel layer (poly-crystalline layer) of the switching element provided to each pixel, the conductive state of the channel layer is liable to be easily fluctuated and hence, there may be a case that the luminance of the pixel driven by the switching element (TFT) is deviated from a given value and brings about the degradation of the image quality of the image display region. Particularly, in the pixel of the active matrix type organic El light emitting display device, since the organic EL element (light emitting portion) and the active element (switching element) which controls the organic EL element are arranged close to each other, light having intensity of several hundred thousands lux is irradiated toward the channel layer of the switching element from the oblique direction. For example, even when a light shielding structure similar to that of the conventional TFT liquid crystal display device described in U.S. Pat. No. 5,561,440 is applied to the pixel of the organic EL light emitting display device, it is impossible to shield the channel layer of the switching element from this strong light. Accordingly, in the present invention, as illustrated in this embodiment, the electrode layer of the capacitive element (capacitor) of the circuit (pixel circuit) formed on every pixel is arranged between the channel layer of the switching element made of polycrystalline silicon (Poly-Si) and the light emitting portion of the organic EL element as a light shielding material so as to prevent the degradation of the image displayed by the organic EL light emitting display device.

In one pixel region PIX surrounded and indicated by a bold broken line in FIG. 2, the conductive layer C1 which constitutes one electrode of the capacitive element C1-CSi mounted on every pixel of the organic EL light emitting display device is formed of material having low optical transmissivity (for example, high-melting-point metal such as molybdenum-tungsten (MoW), titanium-tungsten (TiW), an alloy thereof, or an silicide thereof) between the bank opening portion OPN where the light emitting portion (organic material layer OCT) is provided and a group of switching elements (SW1, SW2, SW3, DT). On the other hand, in this embodiment, another electrode of the above-mentioned capacitive element C1-CSi is formed of polycrystalline silicon layer CSi together with the channel layers of the above-mentioned switching elements SW1, SW2, SW3 and DT. Since the polycrystalline silicon layer CSi absorbs light incident on the layer CSi by 90% at maximum, together with the above-mentioned one electrode (conductive layer C1) of the capacitive element formed above the the polycrystalline silicon layer CSi, it is possible to prevent light from the above-mentioned light emitting portion (organic material layer OCT) from being irradiated to respective channel layers of the above-mentioned group of the switching elements in the pixel region PIX.

As shown in FIG. 1(A) and FIG. 2, in each pixel of the organic EL light emitting display device according to the present invention, the conductive layers CSi, C1 and C2 which constitute electrodes of two capacitive elements (capacitors) C1-CSi, CSi-C2 which are formed respectively in the pixel are also formed below the current supply line PL and the drain line DL. In this manner, by extending the conductive layers CSi, C1, C2 along the current supply line PL which is arranged between the pixel regions and the drain line DL which is arranged close to and parallel to the current supply line PL, the capacitor regions (area in which a pair of electrodes face each other in an opposed manner) of the capacitive elements C1-CSi, CSi-C2 are enlarged at maximum and the light emitting region in the pixel region PIX can be expanded at maximum. As described above, the organic EL light emitting display device makes the light emitting portion of each pixel subjected to the current driving and hence, even when the electrodes C1, C2 of the above-mentioned capacitive elements C1-CSi, CSi-C2 are made to face the current supply line PL and the drain line DL, a crosstalk is hardly generated.

The above-mentioned capacitive elements C1-CSi, CSi-C2 are not limited to the structure in which the capacitive elements C1-CSi, CSi-C2 are overlapped to both of the current supply line PL and the drain line DL which are arranged parallel between the neighboring pixels. That is, depending on the largeness of the capacity regions corresponding to the capacities which are respectively requested to the capacitive elements C1-CSi, CSi-C2, the capacitive elements may be overlapped to either one of the current supply line PL and the drain line DL. In both cases, the capacitive element C1-CSi (portion) and the capacitive element CSi-C2 interrupts leaking of light generated between the neighboring pixels in the extending direction of the scanning signal lines GL. In the organic EL light emitting display device, the capacitive element C1-CSi which is provided for every pixel is necessary to hold the signal voltage (video signal) from the drain line DL. However, it is not necessary to extend the capacitive element C1-CSi below at least one of the current supply line PL and the drain line DL so as to make the capacitive element C1-CSi perform a function of a shielding member to obstruct light between the above-mentioned pixels. That is, leaking of light between the neighboring pixels along the scanning signal lines GL can be suppressed by at least one of the capacitive element C1-CSi and the capacitive element CSi-C2. Here, it is unnecessary that one electrode C2 of the capacitive element CSi-C2 is connected to the current supply line PL through the contact hole Cont-PL as shown in FIG. 1(A) and FIG. 2 and the potential of one electrode C2 may be held at the floating state, for example.

In the embodiment shown in FIG. 2, a boundary between the above-mentioned two conductive layers C1 and C2 appears in the vicinity of the longitudinal center of the pixel region PIX. From a viewpoint of shielding function to cope with the above-mentioned leaking of light between the pixels, it is desirable that a discontinuing portion of the shield member (light shielding member) is not formed in the vicinity of the center of the light emitting portion (organic material layer OCT). For example, it is preferable that the whole shielding member between the pixels is formed of the capacitive element C1-CSi. Further, in place of the above-mentioned capacitive element C1-CSi and the capacitive element CSi-C2, a shielding member having a ring shape, an L shape or a U shape which is electrically independent from the pixel circuit may be newly provided. Further, the ring-shaped shielding member which surrounds the pixel region PIX may be formed in a discontinuing manner at a position sufficiently remote from the center of the light emitting portion (organic material layer OCT) (for example, corner portion of pixel region PIX) and hence, a portion of the shielding member may be replaced with a portion GLS of the scanning signal line GL shown in FIG. 2. Further, it may be possible to newly provide a ring-shaped conductive layer which is electrically separated from the scanning signal line as the shielding member on the same level as the scanning signal line GL.

As shown in FIG. 2, in the pixel region PIX, the capacitive element C1-CSi is provided between the scanning signal line, the control signal lines CL1, CL2 and the opening portion OPN (light emitting portion formed of organic material layer OCT) of the bank and a portion GLS of the scanning signal line GL is arranged at an end portion of the pixel region PIX. Due to such a constitution, light from the opening portion OCT of the bank is hardly irradiated to respective channel layers of a group of switching elements (SW1, SW2, SW3, DT) formed inside the pixel region PIX. Further, by arranging the capacitive elements C1-CSi and the CSi-C2 in such a manner that they overlap the current supply line PL and the drain line DL extending along the end portion of the pixel region PIX, lights from two neighboring pixels are hardly mixed to each other. Accordingly, in the organic EL light emitting display device of this embodiment, desired light emitting quantities (luminance) are obtained from respective organic EL elements which are arranged in the image display region so that beautiful and clear images can be displayed.

As mentioned above, in the organic EL light emitting display device, it is possible to generate strong light at the organic EL element arranged at each pixel region PIX. When such strong light is irradiated to the switching element provided with the channel made of polycrystalline silicon (Poly-Si) (SW1, SW2, SW3, DT in this embodiment), the silicon layer (Si layer) which constitutes the channel gives rise to a photovoltaic effect in accordance with an electric field applied thereto. Accordingly, an electric field generated in the channel (Si layer) generates a hole-electron pair inside thereof in spite of the fact that the switching element applies an electric field of the turn-off state to the channel and hence, the charge holding characteristics of the switching element is deteriorated. For example, the charge (determining control voltage of drive transistor DT) stored in the capacitive element C1-CSi is leaked to the drain line DL through the channel of the switching element (control transistor) SW1 in the turn-off state and, as a result, the electric current supplied to the organic EL element through the drive transistor DT is decreased. Such a problem is not apparent in the conventional TFT type liquid crystal display device and hence, it is impossible for the light shielding structure which has been adopted by such a liquid crystal display device to shield the switching element from the strong light irradiated from the organic EL element. Particularly, in the organic EL light emitting display device of the bottom emission scheme which sequentially laminates the transparent electrode ITO, the organic material layer OCT and the electrode layer from the substrate main surface side (TFT substrate side) and emits light generated at the organic material layer OCT to the TFT substrate side as in the case of this embodiment, light irradiated from the pixel region PIX is liable to be irradiated to the channel of the switching element formed on the pixel region PIX and hence, the image quality of the display image is liable to be degraded due to the control of the switching element (so-called TFT driving).

Accordingly, in the organic EL light emitting display device according to this embodiment, it is designed such that the respective electrodes (conductive layers) C1, C2 of the above-mentioned capacitive elements C1-CSi, CSi-C2 also function as light shielding layers. To be more specific, as shown in FIG. 2, the capacitive elements C1-CSi, CSi-C2 are arranged at both ends of the opening portion OPN of the bank along the current supply line PL and the drain line DL and these capacitive elements C1-CSi, CSi-C2 expand respective widths thereof along the extending direction of the scanning signal line GL (direction which crosses the extending direction of the current supply line PL or the drain line DL). Due to such a constitution, it is possible to obstruct light which leaks in the extending direction of the scanning signal line GL in FIG. 2 with the electrodes C1, C2. When the areas of the electrodes C1, C2 are restricted to ensure desired capacities required by the capacitive elements C1-CSi, CSi-C2, a line M1 which supplies an electric current from the current supply line PL to the transparent electrode finally (see FIG. 1(A), the detail of the line M1 being explained later and the line also being referred to as reference character ALS) is elongated or the width of at least one of the current supply line PL and the drain line DL is widened so as to form light shielding layers which replace the electrodes C1, C2.

Further, as shown in FIG. 2, a portion of the electrode (conductive layer) C1 of the capacitive element C1-CSi is formed between the light emitting region (bank opening OPN) and the switching elements SW1, SW2, SW3 so as to achieve light shielding of the inside (upper side of the light emitting region) of the pixel region PIX. A portion of the electrode C1 which is arranged adjacent to the upper end of the opening OPN of the bank has, to enhance the light shielding effect thereof, a width thereof expanded along the current supply line PL or the drain line DL. Further, the electrode C1 is provided with the contact hole Cont-ITO which connects the line M1 and the above-mentioned transparent electrode ITO electrically at an upper portion thereof as shown in FIG. 1(A).

Further, in this embodiment, to perform light shielding of the lower side of the pixel electrode PIX (the end portion which is arranged close to another pixel region along the current supply line PL or the drain line DL of the pixel region PIX), a portion GLS of the scanning signal line which contributes to driving of the another pixel electrode is arranged as a light shielding layer at an upper end of another pixel region. To observe this constitution from the inside of the pixel region PIX, a portion GLS of the above-mentioned scanning signal line performs the light shielding of the switching element SW1 arranged at the lower side of such a portion from the light emitting region of another pixel region which is arranged close to the upper side of the pixel region PIX.

As has been explained above, in the organic EL light emitting display device according to the present invention illustrated in this embodiment, the capacitive elements (capacitors) and the scanning signal line which are provided to every pixel region are arranged at the upper side, the lower side, the left side and the right side of the light emitting region (organic material layer OCT) respectively so as to prevent light from the organic material layer OCT from being irradiated to the switching elements SW1, SW2 and SW3. The above-mentioned photovoltaic effect which appears in the channel layers of the switching elements does not give any serious influence to the function (turning on within a light emitting period of the light emitting region) compared to the influence given to respective functions of the switching elements SW1, SW2 and SW3. Accordingly, with respect to four switching elements arranged in the pixel region PIX, although the drive transistor DT can be arranged close to the light emitting region compared to other three switching elements, as shown in FIG. 2, it is desirable to arrange the drive transistor DT in a spaced-apart manner from the light emitting region (a light emitting region OPN' at the upper side of the pixel region PIX) and the light shielding member (a portion GLS of the scanning signal line). Further, the current supply line PL which is formed on the electrodes (conductive layers) C1, C2 of the capacitive elements CL-CSi, CSi-C2 in an overlapped manner can also perform light shielding against leaking of light in the same manner as these electrodes C1, C2.

The pixel array (a portion of the image display region) provided to the organic EL light emitting display device of this embodiment shown in FIG. 2 is formed by photolithography using mask of 6 type photo patterns shown in FIG. 3 to FIG. 7. With respect to the photo patterns respectively shown in FIG. 3 to FIG. 7, to facilitate the correspondence to the pixel array structure shown in FIG. 2, a region which corresponds to the pixel region PIX illustrated in FIG. 2 is surrounded by a bold broken frame PIX.

Figure 3:
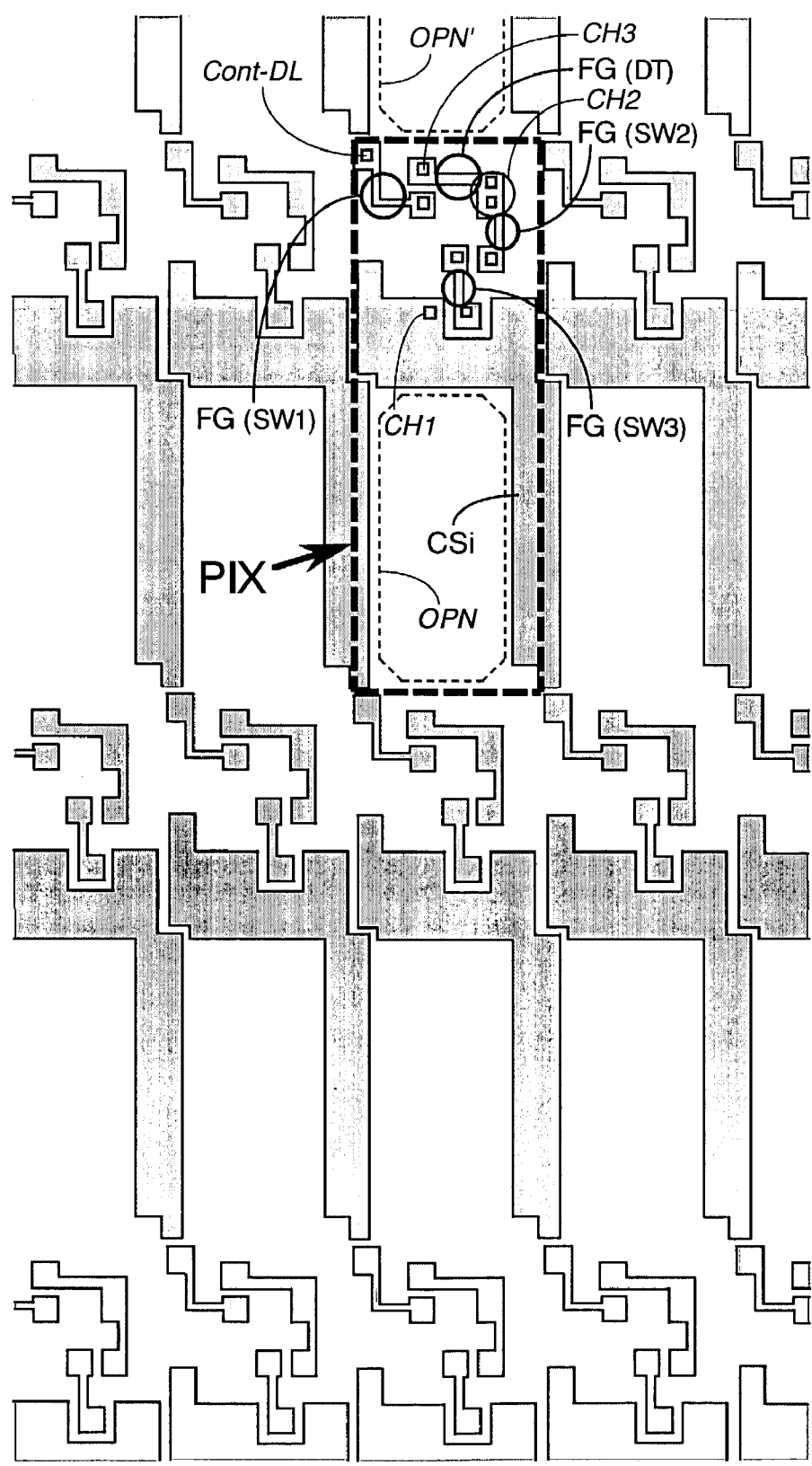
FIG. 3 shows a first photo pattern formed on a photolithography mask used in a step for manufacturing the pixel array shown in FIG. 2.
Figure 4:
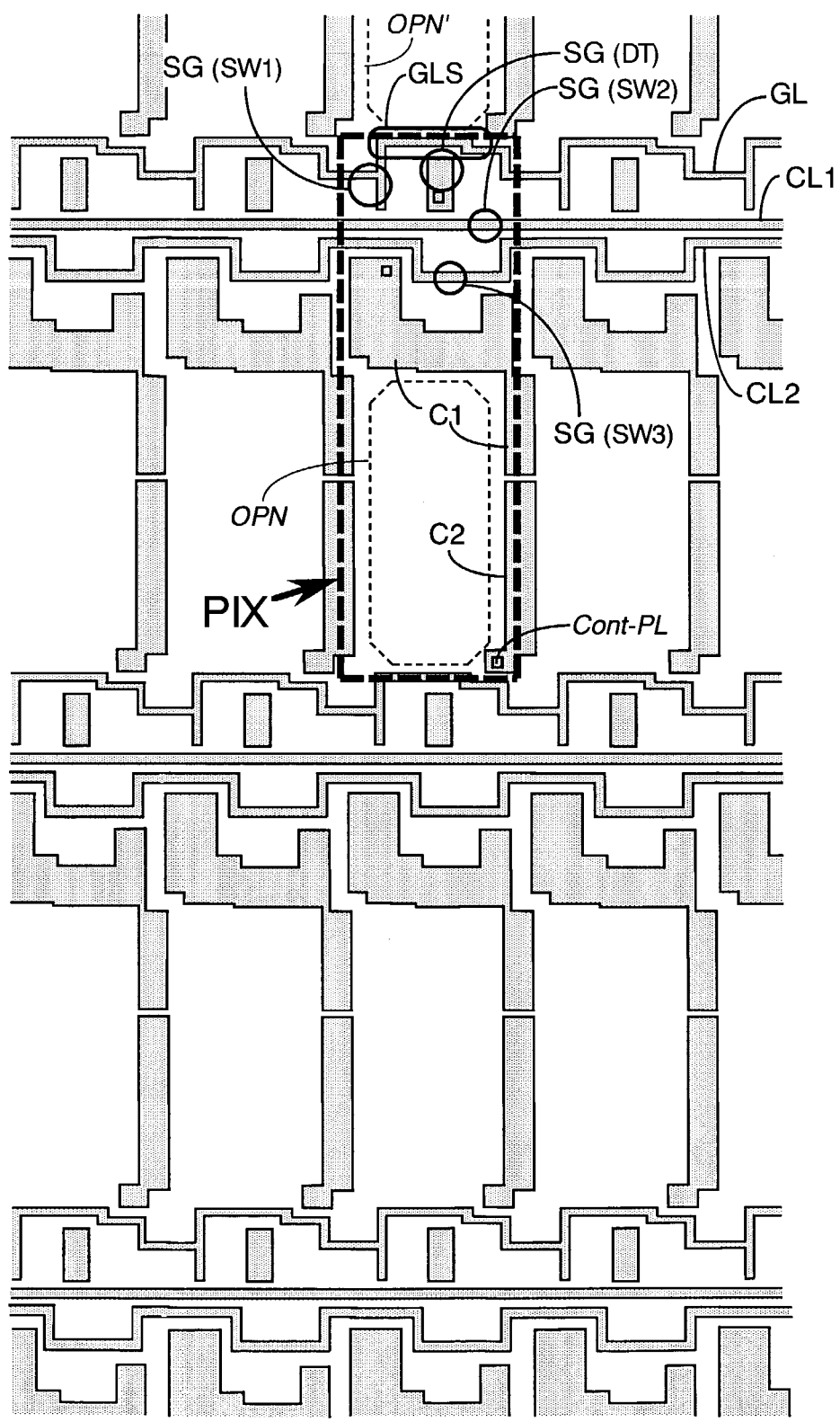
FIG. 4 shows a second photo pattern formed on a photolithography mask used in the step for manufacturing the pixel array shown in FIG. 2.
Figure 6:
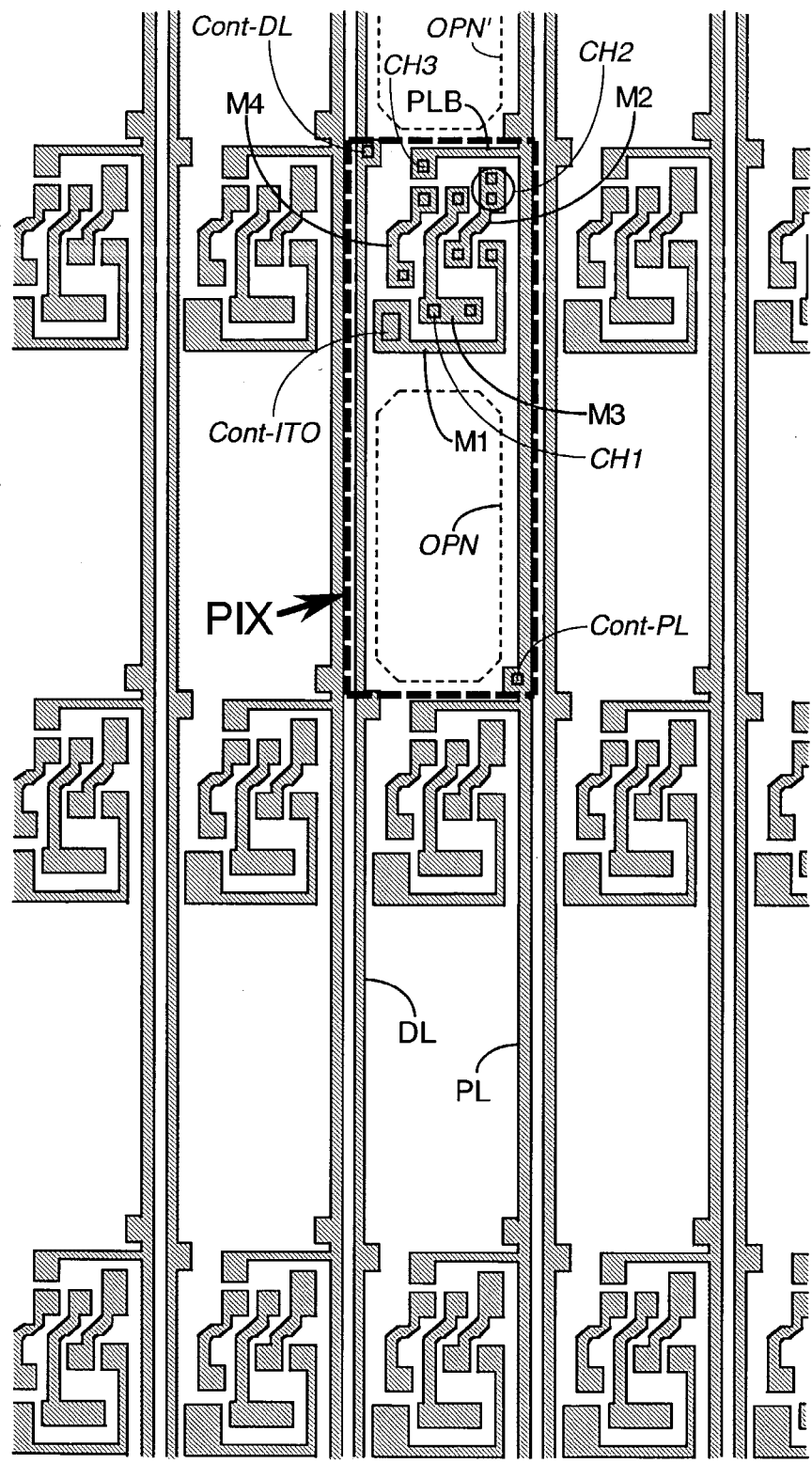
FIG. 6 shows a fourth photo pattern formed on a photolithography mask used in the step for manufacturing the pixel array shown in FIG. 2.

In FIG. 3, FIG. 4 and FIG. 6, to focus on the pixel region PIX exclusively, only a group of rectangular patterns of contact holes (for example, Cont-DL, CH3) shown in FIG. 5 which are relevant to electrical connections with the semiconductor layers and conductive layers formed by respective photo patterns are depicted. Further, in FIG. 3, FIG. 4 and FIG. 6, the bank openings OPN, OPN' of the pixel region PIX and another pixel region which is closely arranged at the upper side of the pixel region PIX are indicated by thin broken line frames. Further, in FIG. 6 and FIG. 7, to focus on the pixel region PIX exclusively, there is shown the rectangular contact hole Cont-ITO which electrically connects the line M1 shown in FIG. 1(A) and the transparent electrode ITO which constitutes a portion of the organic EL element. These constitutional features are, as can be understood from the photo patterns other than the pixel region PIX, not included in the photo patterns corresponding to respective drawings. Reference characters which discriminate these in FIG. 3, FIG. 4 and FIG. 6 are indicated by an italic font.

FIG. 3 shows a first photo pattern used for the formation of the pixel array in which a plurality of pixels in FIG. 2 are arranged in a matrix array. When the quartz substrate is used as the above-mentioned TFT substrate, thin films and openings which constitute the pixel array are sequentially formed on a main surface of the quartz substrate by a photolithography using seven masks on which the first photo pattern to the seventh photo pattern explained hereinafter are depicted. When the soda glass is used as the TFT substrate, thin films and openings which constitute the pixel array are sequentially formed on the insulation film IA which is formed on a main surface of the soda glass in the same manner. Here, in the photolithography performed sequentially using the photo patterns consisting the first to sixth photo patterns, the pixel circuit which drives the organic EL element at each pixel region is completed. In this embodiment, the channel of the switching element included in the pixel circuit is formed of an amorphous silicon layer and the amorphous silicon layer is converted into a polycrystalline silicon layer using a relatively-low-temperature process such as laser irradiation so as to enhance the electron mobility in the channel. Accordingly, a series of processes ranging from the first photo pattern to the sixth photo pattern are also referred to as low temperature Poly-Silicon processes or LTPS processes. On the other hand, in the photolithography which uses the seventh photo pattern, the bank opening OPN which constitutes the light emitting portion of the organic EL element is formed. Accordingly, the process using the seventh photo pattern is also referred to as organic light-emitting diode process or OLED process. By performing these LTPS process and OLED process, the organic EL light emitting display device having the pixel array shown in FIG. 2 is completed.

In the first photo pattern shown in FIG. 3, a pattern in which the channel region of the switching element (TFT in this embodiment) and silicon layers (Si layers) which constitute substrate-side (lower) electrodes of the capacitive elements (capacitors) C1-CSi, CSi-C2 which are included in the pixel circuit are colored is formed. To be more specific, the channel regions FG (SW1), FG (SW2), FG (SW3) and FG (DT) of the switching elements SW1, SW2, SW3, DT formed of polycrystalline silicon layers and the silicon regions CSi which face the above-mentioned conductive layers C1, C2 are formed. Here, the silicon region CSi alleviates a stepped portion of the first insulation film (a gate insulation film GI of the switching element shown in FIG. 8 and FIG. 9) formed on an upper surface of the silicon region CSi thus preventing the rupture of the above-mentioned conductive layer formed on the insulation film. Among the semiconductor layers which are formed in the photolithography processes using the mask on which the first photo pattern is formed, the semiconductor layers which are used in respective channels of the switching elements are hereinafter also generally referred by the reference character FG in the following explanation.

FIG. 4 shows the second photo pattern used for the formation of the pixel array shown in FIG. 2. Using this second photo pattern, on the above-mentioned first insulation film, the scanning signal line GL (also functioning as the control electrode SG (SW1) of the switching element SW1), the control signal lines CL1, CL2, the conductive layers C1, C2 which constitute the upper electrodes of the capacitive elements C1-CSi, CSi-C2 and the control electrode SG (DT) of the drive transistor are collectively formed as a colored pattern shown in FIG. 4. The control signal line CL1 controls the supply of current to the organic EL element LED shown in FIG. 1(B) and applies a control signal to the control electrode SG (SW2) of the switching element SW2 which adjusts the driving conditions of the drive transistor DT. Further, in this embodiment in which the capacitive element CSi-C2 is provided to the pixel circuit for adjusting the driving conditions of the drive transistor DT, there is provided the switching element SW3 which supplies a given charge to the capacitive element CSi-C2 so as to adjust the current supplied to the organic EL element LED in response to the video signal. Accordingly, in this embodiment, there is also provided the control signal line CL2 which applies a control signal to the control electrode SG (SW2) of the switching element SW3. Among the conductive layers which are formed in the photolithography processes using the mask on which the second photo pattern is formed, the conductive layers which are used as respective control electrodes of the switching elements (including the drive transistor DT) are hereinafter also generally referred by the reference character SG in the following explanation.

As mentioned above, the scanning signal line GL has a function of controlling the acquisition of the video signal in the channel region of the switching element SW1 to the pixel region as well as a function of obstructing light leaked toward a group of switching elements of the pixel region from another pixel region arranged close to the pixel region. Accordingly, as shown in FIG. 4, the scanning signal line GL is formed in a step shape which repeats bending with respect to the extending direction of the scanning signal line GL (lateral direction in FIG. 4). From a viewpoint of enhancing the light shielding characteristics of the scanning signal line GL, it is preferable to make the portion GLS which also has a light shielding function approach an end of the pixel region (that is, a light emitting portion OCT of another pixel region arranged close to the pixel region) as close as possible. Further, the upper electrodes (conductive layers) C1, C2 of the capacitive elements C1-CSi, CSi-C2 which are formed together with the scanning signal line GL are also required to have the light shielding function as mentioned previously. Accordingly, the conductive layers which are formed using the second photo pattern are formed with a material and a thickness suitable for suppressing the optical transmissivity thereof. As the material of the conductive layers, by focusing on the absorbance and the reflectance, a high-melting-point metal (refractory metal) as exemplified by molybdenum (Mo), tungsten (W), titanium (Ti), chromium (Cr), an alloy thereof and a silicide thereof are recommended from a viewpoint of the absorbance, while aluminum (Al) and an alloy thereof are recommended from a viewpoint of the reflectance. These materials may be laminated in a plural layers.

Although the portion GLS of the scanning signal line which also functions as the light shielding member is configured to have a width equal to the width of the portion which constitutes the control electrode SG (SW1) of the switching element SW1, the width of the portion GLS of the scanning signal line may be increased compared to the width of other portions of scanning signal line GL so as to enhance the light shielding performance. Due to such a constitution, the light shielding characteristics with respect to the pixel region (indicated at the upper side of the pixel region PIX, for example, in FIG. 4) which is connected to the scanning signal line of next stage is enhanced. Further, in this embodiment, although the scanning signal line GL is formed in a step shape, it may be formed in a straight line in the same manner as the conventional TFT type liquid crystal display element driven by the active matrix type method. The shape of the scanning signal line GL may be suitably changed corresponding to the number and the arrangement of the switching elements formed every pixel region.

FIG. 5 shows the third photo pattern used in the formation of the pixel array shown in FIG. 2. The third photo pattern is a pattern for forming the contact holes which are dug toward the main surface of the substrate (TFT substrate) from an upper surface of the second insulation film (an insulation film IB shown in FIG. 8 and FIG. 9, for example) which covers the conductive layer of the scanning signal line GL or the like which is formed using the second photo pattern. Respective contact holes formed using this pattern are served for electrically connecting the conductive layer (formed on the above-mentioned second insulation film) which will be explained later in conjunction with the fourth photo pattern shown in FIG. 6 and either one of the semiconductor layer formed using the first photo pattern and the conductive layer formed using the second photo pattern. Accordingly, out of 12 contact holes indicated inside the pixel region PIX shown in FIG. 5, 9 contact holes (including the contact holes Cont-DL, CH1, CH2 and CH3) are also shown on upper surfaces of the semiconductor layers (CSi, FG) in the pixel region PIX shown in FIG. 3. Further, out of 12 contact holes shown in the pixel region PIX shown in FIG. 5, 3 remaining contact holes (including the contact hole Cont-PL) are also shown on upper surfaces of the conductive layers (C1, C2, SG (DT)) in the pixel region PIX shown in FIG. 4.

The function of the contact holes shown in FIG. 5 are briefly explained by taking the contact holes Cont-PL and Cont-DL as an example in conjunction with FIG. 1(B) and FIG. 2. The contact hole Cont-PL is served for connecting the upper electrode (conductive layer) C2 of the capacitive element CSi-C2 formed on the above-mentioned first insulation film using the second photo pattern and the current supply line PL which is formed on the above-mentioned second insulation film using the fourth photo pattern shown in FIG. 6 through the second insulation film. In response to a storage quantity of charge in the lower electrode (semiconductor layer) CSi of the capacitive element CSi-C2 which is changed at the timing of applying the control signal (scanning signal) to the switching element SW1 from the scanning signal line GL, the charge is supplied to the upper electrode (conductive layer) C2 from the current supply line PL via the contact hole Cont-PL.

On the other hand, the contact hole Cont-DL is served for connecting one end (also referred to as the drain region) of the channel layer FG (SW1) of the switching element (control transistor) SW1 which is formed using the first photo pattern and is covered with the above-mentioned first insulation film and the drain line DL formed on the above-mentioned second insulation film using the fourth photo pattern through the first and second insulation films. When the channel layer FG (SW1) of the switching element (control transistor) SW1 is turned on due to the application of the control signal from the scanning signal line GL, the video signal (voltage signal) from the drain line DL is applied to the upper electrode C1 of the capacitive element C1-CSi through the contact hole Cont-DL and the channel layer FG (SW1). A charge quantity which is stored in the capacitive element C1-CSi controls the voltage applied to the control electrode SG (DT) of the drive transistor DT together with a charge quantity stored in the capacitive element CSi-C2. Accordingly, in response to the timing that the switching element SW1 is turned on, an electric current corresponding to the video signal is supplied to the channel FG (DT) of the drive transistor DT. The electric current corresponding to the video signal is written in the transparent electrode ITO through the switching element SW2, the line M1 and the contact hole Cont-ITO. An electric current corresponding to the video signal which is written in the transparent electrode ITO flows into another electrode CM (explained later in conjunction with FIG. 8 and FIG. 9) which is included in the organic EL element LED together with the organic material layer OCT through the organic material layer OCT formed on the transparent electrode ITO so that the organic material layer OCT (an electro-luminescence material layer included in the organic material layer) is made to generate light.

FIG. 6 shows the fourth photo pattern used in the formation of the pixel array shown in FIG. 2. Using the fourth photo pattern, the current supply line PL and the branch line PLB thereof, the drain line DL and respective lines M1, M2, M3 and M4 which are connected to at least one of a group of switching elements (SW1, SW2, SW3, DT) including the above-mentioned drive transistor are formed on the above-mentioned second insulation film as a colored pattern shown in FIG. 6.

The line M1 is formed as a current path provided between the output side of the switching element SW2 and the node (contact hole) Cont-ITO connected to the transparent electrode ITO of the organic EL element LED. The line M2 is formed as a charge path which is provided between one end of the drive transistor DT and one end of the switching element SW3. The line M3 electrically connects another end of the switching element SW3, the semiconductor layers CSi which constitute lower electrodes of the capacitive element C1-CSi and the capacitive element CSi-C2 and the control electrode SG (DT) of the drive transistor DT to each other. Accordingly, the line M3 performs a function of a charge path which extends from another end of the switching element SW3 to the semiconductor layer CSi and a voltage signal path which extends from the node (contact hole) CH1 to the control electrode SG (DT) of the drive transistor. The line M4 is formed as a voltage signal path which is provided between the output side (also referred to as a source) of the switching element SW1 and the upper electrode C1 of the capacitive element C1-CSi.

Since the current supply line PL is also included in the conductive layer formed by the fourth photo pattern, with respect to the conductive material formed in the photolithography process using this mask, it is preferable to reduce the resistance of such a conductive material compared to a conductive material which is formed in the photolithography process using the mask of the second photo pattern. For example, it is recommendable to use aluminum or an alloy or silicide containing aluminum as the conductive material formed using the fourth photo pattern.

In this embodiment, using this aluminum which constitutes the conductive material, the current supply line PL and the branch line PLB, the drain line DL and a group of lines M1, M2, M3, M4 are formed on the second insulation film. Further, via the contact holes formed by the third photo pattern using the aluminum, the semiconductor layers CSi, Mg which lie below the second insulation film, the electric current path which reaches any one of the conducive layers C1, C2, SG (DT), the charge path and the voltage signal path are also respectively formed. Accordingly, in the explanation of this embodiment described hereinafter, the above-mentioned conductive layers PL, PLB, DL, M1, M2, M3, M4 which are formed by the photolithography process using the mask on which the fourth photo pattern is formed may be also indicated by the reference characters, AL, ALS.

Figure 7:
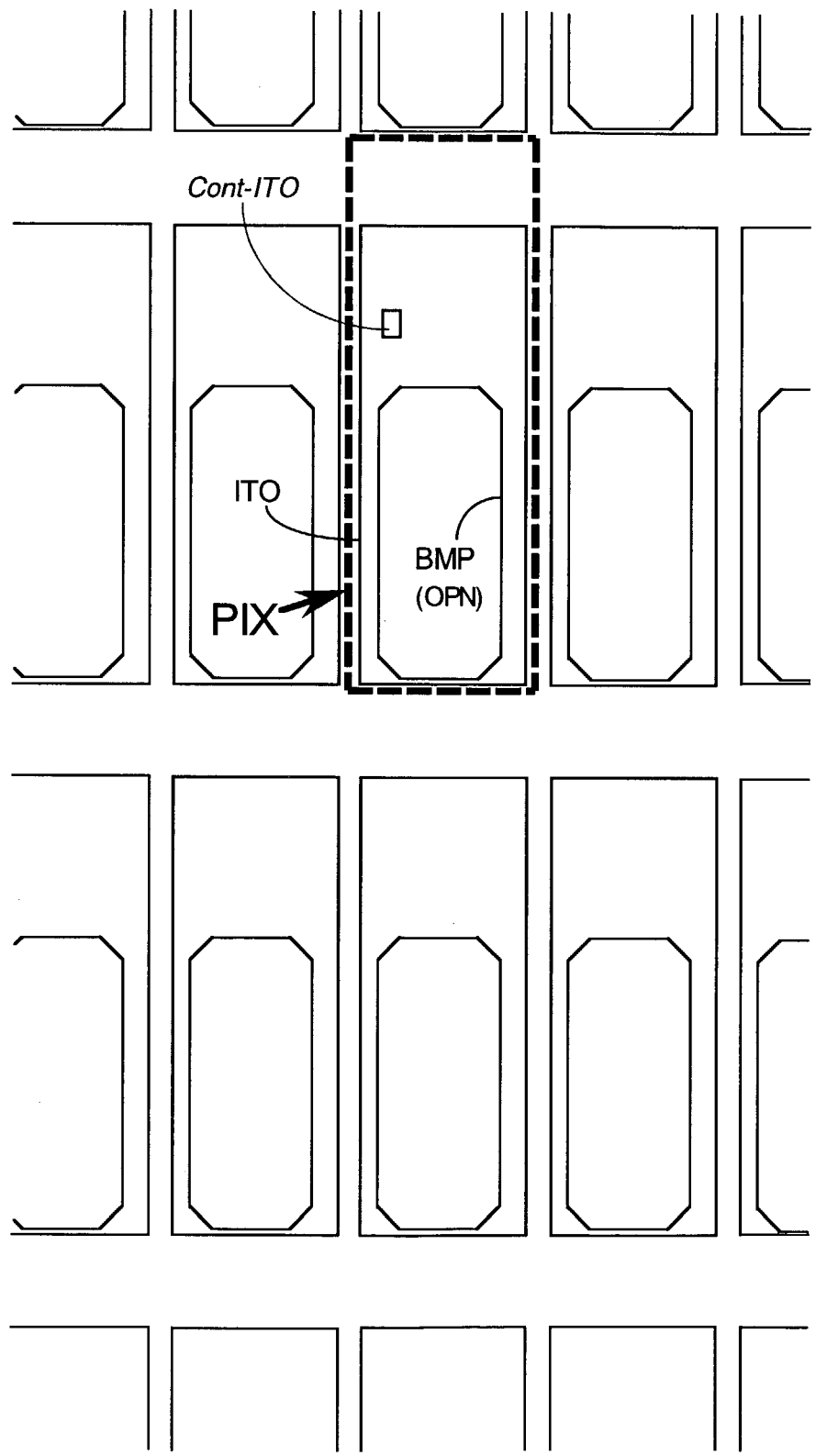
FIG. 7 shows a fifth photo pattern and a sixth photo pattern formed on a photolithography mask used in the step for manufacturing the pixel array shown in FIG. 2 together.

FIG. 7 shows the fifth photo pattern as well as the sixth photo pattern used for the formation of the pixel array shown in FIG. 2. Here, before performing the photolithography process using the mask having the fifth photo pattern, the third insulation film (the insulation film IC shown in FIG. 8 and FIG. 9) is formed on the conductive layers AL such as the current supply line PL, the line M1 and the like using the fourth photo pattern, and the contact holes Cont-ITO are formed in the region which is positioned above the line M1. Any drawings which are relevant to this process is omitted from this specification.

The fifth photo pattern has only the pattern indicated by a rectangular frame ITO shown in FIG. 7. Due to such a pattern, the transparent electrode ITO is formed on the above-mentioned third insulation film in a strip shape and the portion of the transparent electrode ITO is electrically connected with the line M1 through the contact hole Cont-ITO. The transparent electrode ITO which is formed in the photolithography process using the mask having the fifth photo pattern is formed of an amorphous layer or a polycrystalline layer of a conductive oxide which allows light to path therethrough and is typically represented by an indium-tin oxide (also abbreviated as ITO) and an indium-zinc oxide (also abbreviated as IZO). In the organic EL light emitting display device, it is necessary to form an electro-luminescence material layer (included in the organic material layer OCT) which constitutes the light emitting portion such that the electro-luminescence material layer has a uniform thickness and flatness. Further, it is required to expel a high temperature process which decomposes the organic material layer OCT from the manufacturing process. Under such circumstances, with respect to the above-mentioned conductive oxide such as the indium-tin-oxide or the like, even when the temperature of heat treatment is suppressed at a low temperature, it is possible to obtain a film with small surface roughness and hence, the conductive oxide is suitable for the organic EL light emitting display device shown in this embodiment. After forming the transparent electrode ITO for every pixel region in the photolithography process using the mask having the fifth photo pattern, a fourth insulation film which is formed on the bank BMP explained later is formed on an upper surface of the transparent electrode ITO and an upper surface of the above-mentioned third insulation film on which the transparent electrode ITO is not formed.

The sixth photo pattern includes only a pattern indicated by an octagonal frame BMP shown in FIG. 7. Due to such a constitution, an octagonal opening is formed in the fourth insulation film which covers the upper surfaces of the above-mentioned transparent electrode ITO and the third insulation film thus completing a bank BMP. The bank BMP (the fourth insulation film) is formed of an organic film such as polyimide or an inorganic film such as $SiO_2$. The light emitting region of the organic EL element is formed by supplying the organic material in a sublimed state or as droplets to the transparent substrate ITO and hence, it is recommendable to form indents which separate the electric current which flows into the organic material layer OCT (the electro-luminescence material layer included in the organic material layer OCT) for every pixel. Accordingly, the bank BMP formed of an insulation film which separates the light emitting region for every pixel is formed on the transparent electrode ITO. In the organic EL light emitting display device of this embodiment, the bank BMP having the octagonal opening portion (indicated by the reference character OPN in FIG. 2) is overlapped to the periphery of the transparent electrode ITO and the center portion (corresponding to the light emitting region) of the transparent electrode ITO is exposed through the opening of the bank BMP.

In the organic EL light emitting display device according to this embodiment, the above-mentioned fourth insulation film which constitutes the bank BMP is formed of either an inorganic material such as $SiO_2$, $SiN_x$ or the like and a black material. The bank BMP which is formed of the latter material is referred to as a black bank hereinafter. This black bank BMP is formed of positive-type photosensitive black polyimide, for example. As this type of material, in this embodiment, a product JR 3120P made by Nitto Denko Corporation is exemplified. Since the organic material layer OCT is formed in the opening of the bank BMP as mentioned above, the light emitting region included in the organic material layer OCT and the bank BMP are optically coupled. Accordingly, if the bank BMP is transparent or semitransparent with respect to light from the organic material layer OCT, light from the organic EL element LED formed on a certain pixel propagates into the inside of the bank BMP and there may be a case that the light leaks to another pixel which is arranged close to the pixel. This leaking of light between the pixels is recognized as smear by a viewer. Although the bank (bank layer) BMP surely separates the electric current which flows in the light emitting region for every pixel and enhances the definition of the display image of the organic EL light emitting display device, the bank (bank layer) BMP has the possibility that the image quality of the display image is extremely deteriorated due to light from the light emitting region in which the light propagates. Further, light having the intensity of several hundred thousands luxs is irradiated from the light emitting region formed on each pixel of the organic EL emitting display device.

To cope with the problem on leaking of light in the organic EL light emitting display device which cannot be prevented by such a light shielding structure similar to that of the conventional TFT type liquid crystal display device, according to the present invention, in the pixel region shown in the plan view, members which are included in the pixel circuit are formed of a light shielding material. That is, as in the case of the organic EL light emitting display device described in this embodiment, respective upper electrodes C1, C2 of the capacitive elements C1-CS1, CSi-C2 and the portion GLS of the scanning signal line GL are arranged in the periphery of the light emitting region so as to obstruct leaking of light between the pixel. Further, according to the present invention, in the pixel region which is shown in the cross sectional views (see FIG. 8 and FIG. 9), the black bank BMP is arranged close to the light emitting region thus obstructing light propagating from a side surface of the light emitting region to a main surface of the substrate (SGP in FIG. 8 and QGP in FIG. 9) through a group of switching elements. Here, in this specification, the above-mentioned light shielding structure of the black bank BMP constitutes a novel structure in the organic EL light emitting display device and is disclosed as the separate invention from the light shielding structure which uses members included in the previously-mentioned pixel circuit. However, the light shielding structure which adopts both of them also constitutes a novel structure.

Figure 8:
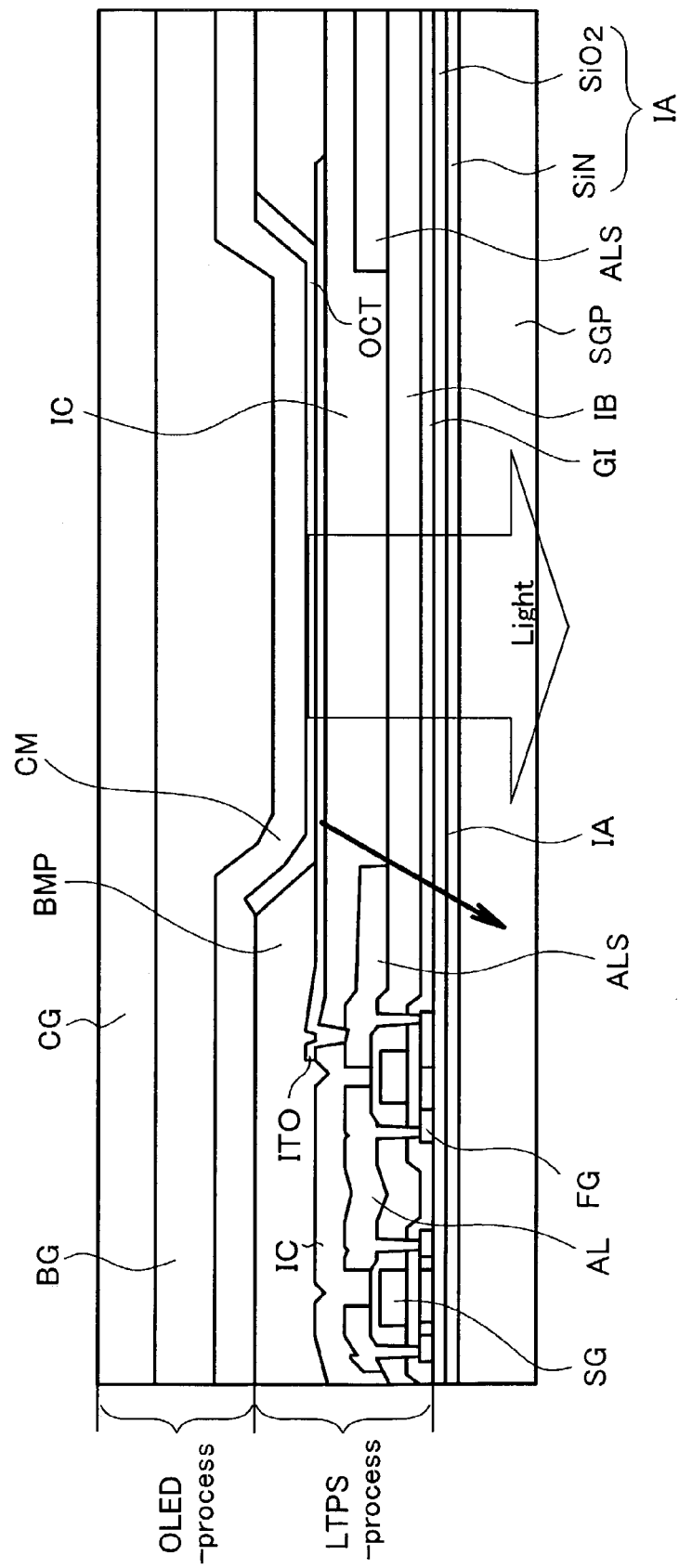
FIG. 8 shows a cross-sectional structure of the pixel of the organic EL light emitting display device according to the present invention which is formed on a glass substrate made of soda glass.

FIG. 8 is the cross sectional view of the pixel region of the organic EL light emitting display device according to the present invention which is formed on the substrate SGP made of soda glass. When the soda glass substrate SGP is used as the TFT substrate, a silicon nitride layer $SiN_x$. and a silicon oxide layer $SIO_2$ are sequentially laminated to the substrate SGP thus forming an insulation film IA. On portions of an upper surface of the insulation film IA on which the switching elements SW1, SW2, SW3 and DT are formed, semiconductor channels FG are formed using polycrystalline silicon (Poly-Si). The semiconductor channels FG are formed in the above-mentioned photolithography step which uses the mask having the first photo pattern.

The upper surfaces of the semiconductor channels FG are, together with an upper surface of the insulation film IA on which the semiconductor channels FG are not formed, covered with an insulation film GI made of silicon oxide $SiO_2$. The insulation film GI provides an insulation between the channel of the switching element and the control electrode which controls the conductive state of the channel and is also referred to as a gate insulation film. This insulation film GI may be formed of silicon nitride $SiN_x$. On portions of an upper surface of the insulation film GI on which the switching elements SW1, SW2, SW3 and DT are formed, respective control electrodes (conductive layers) SG are formed by a photolithography step which uses the above-mentioned mask having the second photo pattern. Further, although not shown in FIG. 8, the above-mentioned capacitive elements C1-CSi and CSi-C2 are also formed such that the insulation film GI is sandwiched between the lower electrode CSi which is formed together with the semiconductor channel FG and the upper electrodes C1, C2 which are formed together with the control electrode SG.

The upper surface of the control electrode SG is, together with the upper surface of the insulation film GI on which the control electrode SG is not formed, covered with an insulation film IB formed of silicon oxide $SiO_2$. On an upper surface of the insulation film IB, lines (conductive layers) AL, ALS which are connected to the switching elements are formed by a photolithography step using the above-mentioned mask having the fourth photo pattern. Although two switching elements shown in FIG. 8 respectively correspond to the drive transistor DT and the switching element SW2 shown in FIG. 2, for facilitating the preparation of the drawing, the switching element is depicted in a deformed shape. As shown in FIG. 8, the conductive layers AL, ALS are connected to the upper surface of the semiconductor channel FG through contact holes Cont which penetrate the insulation film GI, IB.

On upper surfaces of the conductive layers AL, ALS and the insulation film IB, an insulation film IC formed of silicon oxide $Sio_2$ or silicon nitride $SiN_x$ is formed. On the insulation film IC, a transparent electrode ITO of the organic EL element is formed by a photolithography step using a mask having the above-mentioned fifth photo pattern. The transparent electrode ITO is connected to the conductive layer ALS through a contact hole Cont-ITO which is formed by penetrating the insulation film IC. The black bank BMP is formed such that the black bank BMP covers portions of the insulation film IC and the transparent electrode ITO. In the opening portion of the black bank BMP, an organic material layer OCT including a light emitting region of the organic EL element is formed. The organic material layer OCT is formed between the transparent electrode ITO and the electrode CM and may include an electron transfer layer and a hole transfer layer together with the light emitting portion. Due to an electric current which flows between the electrodes ITO and CM of the organic EL element, light is irradiated from the light emitting region of the organic material layer OCT. The organic EL light emitting display element described in this embodiment has an electrode CM side thereof covered with a member CG such as a sealing glass or an end-sealing material and inert gas such as nitrogen is sealed in a space BG defined between the sealing member CG and the electrode CM. This space BG may be sealed by a mold or the like which is used in a semiconductor process. Further, the upper surface of the electrode CM may be covered with an insulation film in place of the sealing member BG.

Light from the organic material layer OCT arranged at the opening portion of the bank is irradiated toward the lower side (substrate SGP side) as indicated by two arrows in FIG. 8. Accordingly, an image displayed by the organic EL light emitting display device is always formed on a lower surface of the substrate SGP. When the light which is deflected and irradiated sideward from the organic material layer OCT is directly irradiated to the semiconductor channel FG of the switching element, the image quality of an image displayed by the organic EL light emitting display device driven by the switching element is degraded. To cope with this problem, in the cross-sectional structure of the pixel region shown in FIG. 8, the portion ALS of the line AL which is connected to the switching element is extended to the opening portion side of the bank. In the structure shown in FIG. 8 which uses the portion ALS of the line AL as the light shielding member, the line M1 and the branch line PLB of the current supply line shown in FIG. 1(A) and FIG. 6 are formed in a deformed shape. Due to the portion ALS of this line AL, an irradiation angle of the light from the organic material layer OCT is restricted as indicated by a thin arrow in FIG. 8 so that the light from the organic material layer OCT is not irradiated to the semiconductor channel FG. As shown in FIG. 8, the opening portion of the bank BMP is formed in a tapered shape and hence, an end portion of the organic material layer OCT is overlapped to an oblique face which borders the opening of the bank BMP. The portion of the organic material layer OCT which is inclined with respect to a main surface of the substrate SGP in this manner transmits the light in an unexpected direction. To shield such an unexpected light, the portion ALS of the line AL is formed such that the portion ALS is extended to the opening portion of the bank BMP. The present invention exhibits the advantageous effects in the so-called bottom emission type organic EL light emitting display device.

Figure 9:
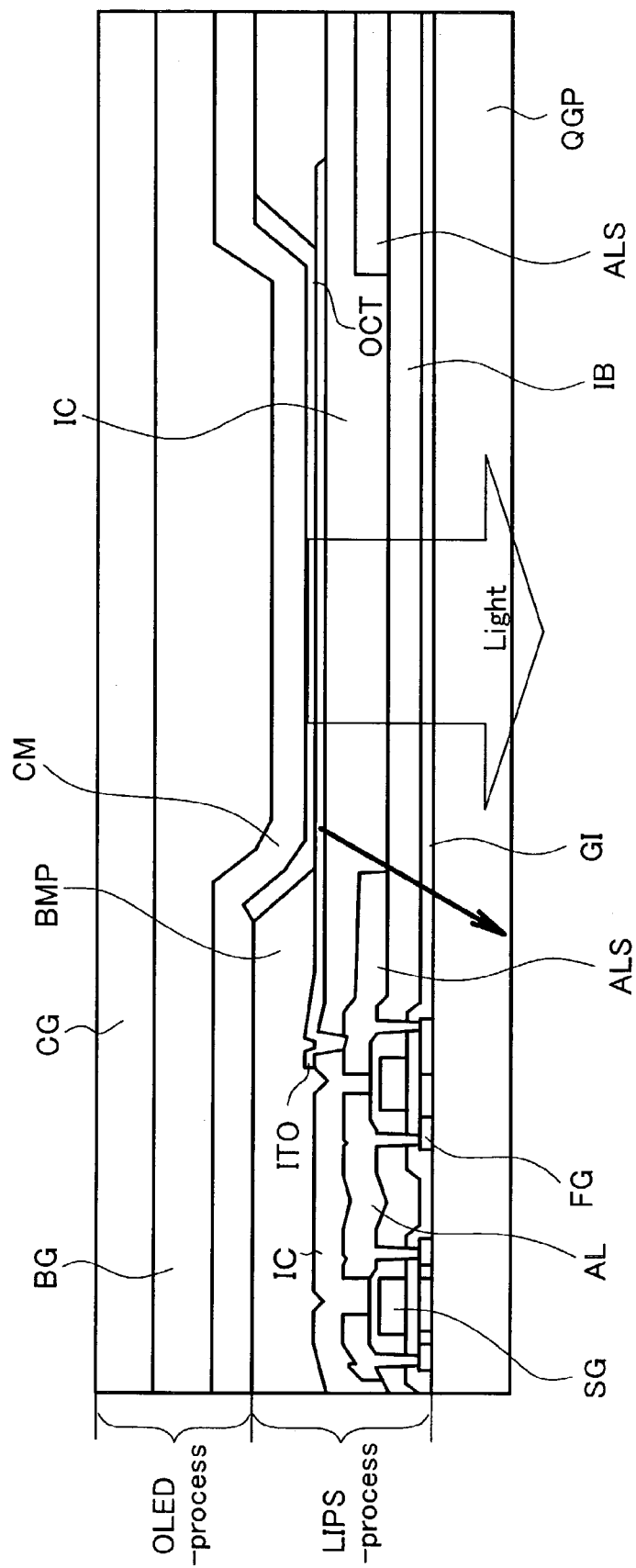
FIG. 9 shows a cross-sectional structure of the pixel of the organic EL light emitting display device according to the present invention which is formed on a quartz substrate.

FIG. 9 is a cross-sectional view of the pixel region of the organic EL light emitting display device according to the present invention which is formed on a quartz substrate QGP. A point which makes the cross-sectional structure shown in FIG. 9 different from the cross-sectional structure shown in FIG. 8 lies in that the insulation film IA is not formed in the former structure. In case that the soda glass substrate SGP is adopted, the insulation film IA is provided for protecting the semiconductor channel FG from the impurities of the soda glass substrate SGP. However, the probability that the impurities propagate from the quartz substrate QGP to the semiconductor channel FG is extremely small and hence, the insulation film IA is not necessary in the organic EL light emitting display device which is formed on a main surface of the quartz substrate QGP. Here, except for the insulation film IA, the cross-sectional structure shown in FIG. 9 is substantially equal to that shown in FIG. 8. Also in the cross-sectional structure shown in FIG. 9, in the same manner as the cross-sectional structure shown in FIG. 8, the end portion of the bank and the portion ALS of the line AL are overlapped to each other and hence, it is possible to prevent the propagation of the light reflected on the end portion of the bank toward the semiconductor channel FG. Accordingly, in both of the cross-sectional structures shown in FIG. 8 and FIG. 9, it is possible to obtain large advantageous effect in the reduction of smear and the enhancement of contrast irrespective of the optical transmissivity of the bank material (for example, even when the bank is a transparent bank).

Figure 10:
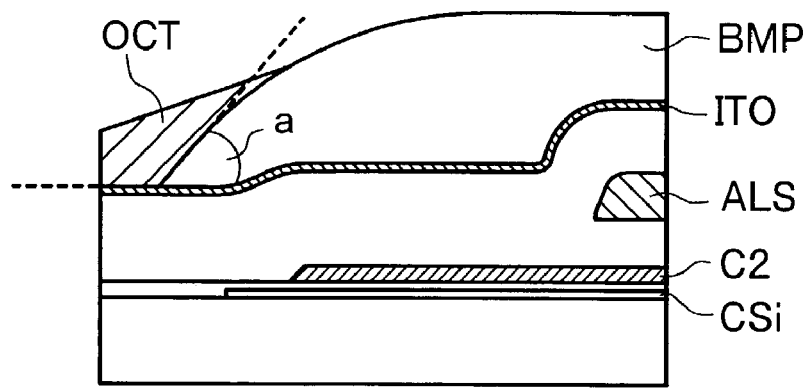
Figure 10:
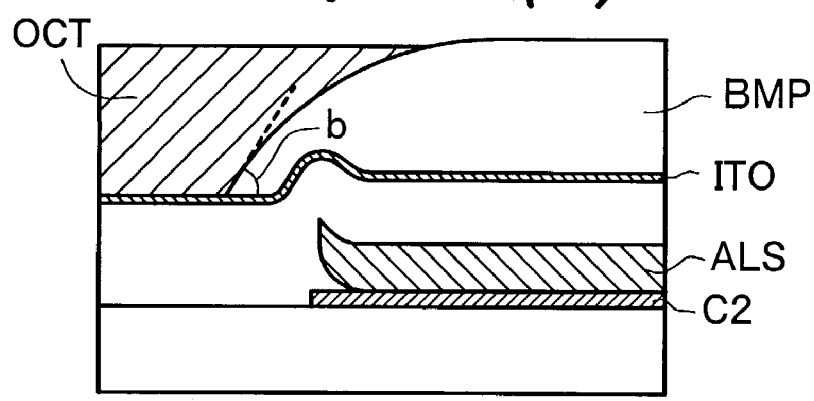
Figure 10:
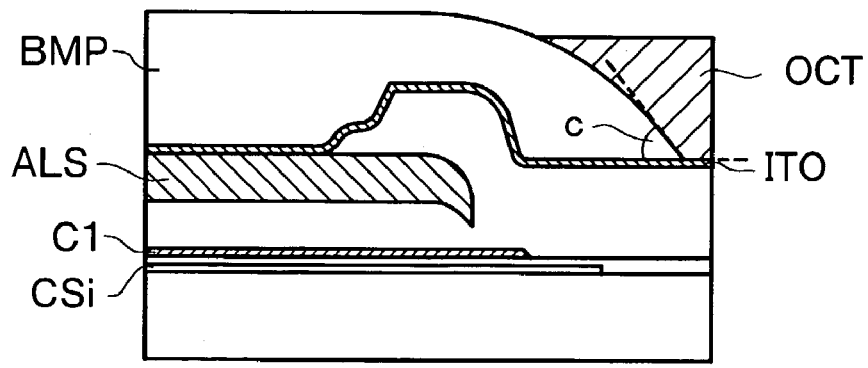

FIG. 10(a) to FIG. 10(c) show the cross-sectional structure of the pixel region PIX which constitutes one of a plurality of pixels which are arranged in the pixel array shown in FIG. 2. FIG. 10(a) shows a cross section of the portion of the pixel region PIX taken along a dashed line A—A. In this portion, the conductive layer ALS of the drain line DL and the capacitive element CSi-C2 are overlapped to each other and the bank BMP and the light emitting region OCT of the organic EL element abut each other. In FIG. 10(a), a taper angle "a" made by the transparent electrode ITO and the opening end portion (oblique surface) of the bank BMP formed on the transparent electrode ITO is held within 50 degrees. Here, the upper electrode C2 of the capacitive element CSi-C2 which functions as a shield at the opening end portion of the bank BMP is spaced apart from the end portion of the opening of the bank BMP to an extent that light from the organic material layer OCT does not turn around and reach another pixel region arranged close to the left side of the pixel region PIX.

FIG. 10(b) shows a cross section of the portion of the pixel region PIX taken along a dashed line B—B and the contact hole Cont-PL is formed in the portion. In FIG. 10(b), there is shown the conductive layer ALS of the current supply line PL which is bonded to the upper surface of the conductive layer C2 (portion projected from the capacitive element CSi-C2) which constitutes the upper electrode of the capacitive element CSi-C2 at the contact hole. In FIG. 10(b), a taper angle "b" made by the transparent electrode ITO and the opening end portion (oblique surface) of the bank BMP formed on the transparent electrode ITO is about 57 degrees. Here, the conductive layer C2 (the upper side electrode of the capacitive element CSi-C2) which functions as a shield at the opening end portion of the bank BMP is spaced apart from the end portion of the opening of the bank BMP to an extent that light is not directly propagated from a boundary between the opening of the bank BMP and the organic material layer OCT to the channel regions of the switching elements (SW1, SW2, SW3, DT) of the pixel arranged close to the pixel region PIX.

FIG. 10(c) shows a cross section of the portion of the pixel region PIX taken along a dashed line C—C, wherein the capacitive element C1-CSi which is arranged between the light emitting region (the organic material layer OCT) and a group of switching element SW1, SW2, SW3, DT and the conductive layer ALS of the line M1 which is arranged above the capacitive element C1-CSi and is bonded to the transparent electrode ITO are shown. The upper electrode C1 of the C1-CSi is disposed close to a boundary between the opening end portion of the bank BMP and the light emitting region (the organic material layer OCT) of the organic EL element and shields the switching element SW3 and the like from light emitted from the organic material layer OCT. In FIG. 10(c), the upper electrode C1 is extended to the left side and is expanded between the organic material layer OCT and a group of switching elements thus sufficiently performing the function of shielding respective channels of a group of switching elements from light emitted from the organic material layer OCT. In FIG. 10(c), a taper angle "c" made by the transparent electrode ITO and the opening end portion (oblique surface) of the bank BMP formed on the transparent electrode ITO is held within 50 degrees.

As has been explained in conjunction with FIG. 10(a) to FIG. 10(c), the taper angle made by oblique surface of the opening of the bank BMP and the main surface of the transparent electrode ITO depends on the arrangement of the end portion (portion which abuts the transparent electrode ITO) of the bank BMP and the shielding layer (light shielding member) exemplified as the upper electrodes C1, C2 of the capacitive element C1-CSi and the capacitive element CSi-C2. The positional relationship between the end portion of the bank BMP and the end portion of the shielding layer is explained in conjunction with models shown in FIG. 11(a) and FIG. 11(b).

Figure 11:
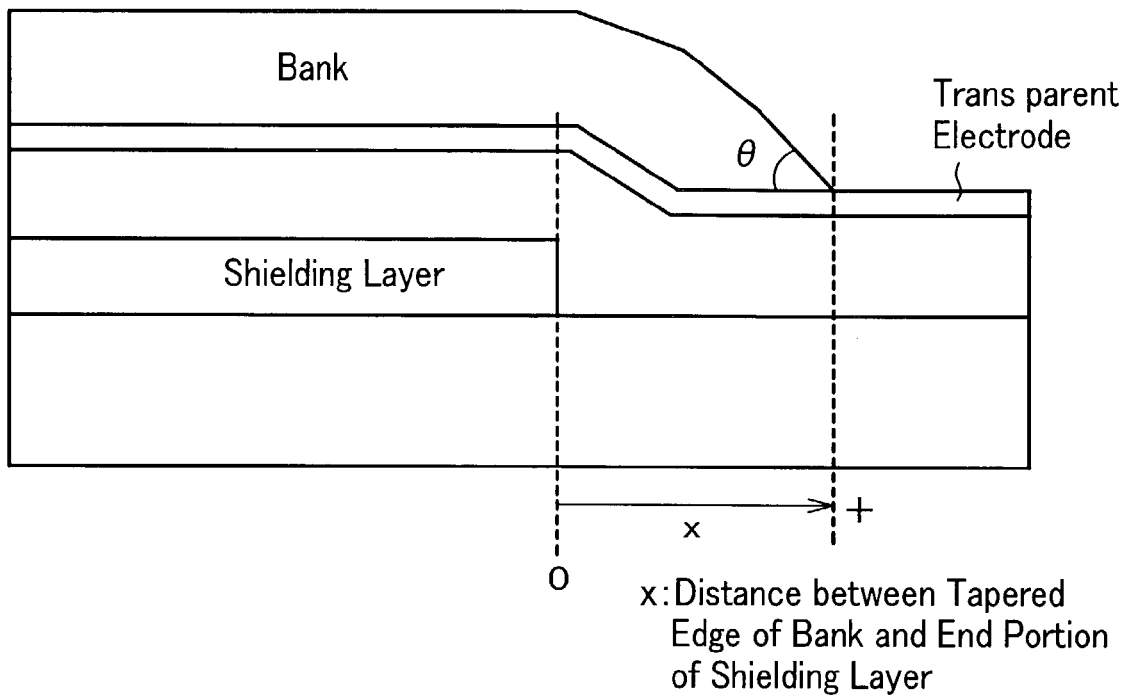
Figure 11:
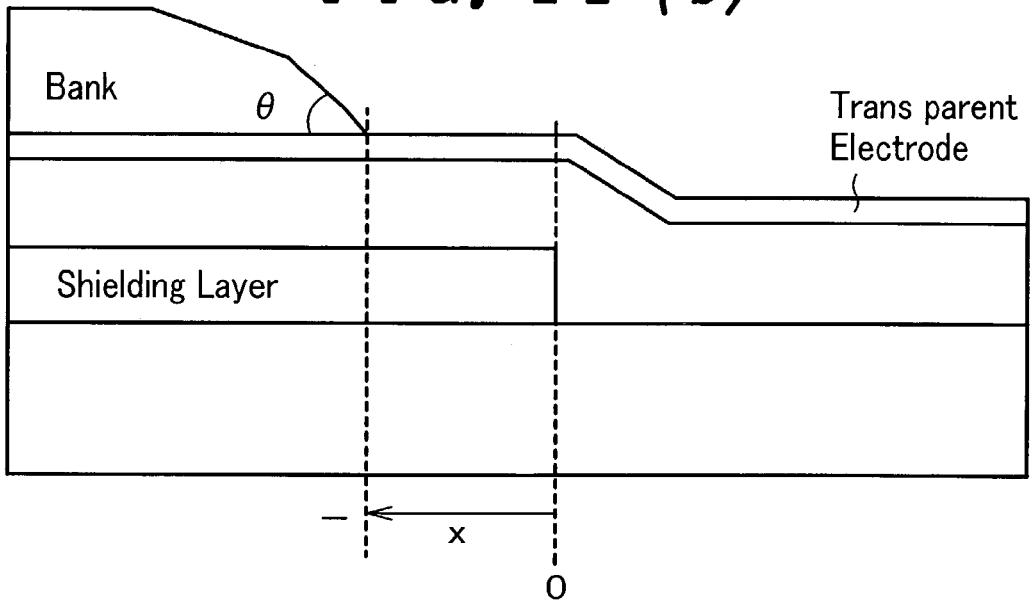

FIG. 11(a) shows the bank which is projected outwardly from the end portion of the shielding layer, wherein the position of an edge of the bank is determined by an axis X of coordinates which set the end portion of the shielding layer as a 0 point (a base point). The position X of the edge of the bank formed outside the shielding layer is expressed by a value having plus (+). That is, the position of the edge of the bank falls within a range of X>0. The greater the distance that the bank is projected from the end portion of the shielding layer (the greater the distance that the edge of the bank extends toward the right side in FIG. 11(a)), the value of X is increased.

FIG. 11(b) shows the bank which is retracted inwardly from the end portion of the shielding layer, wherein the position of an edge of the bank is positioned on the shielding layer. Also in FIG. 11(b), the position of the edge of the bank is determined by the above-mentioned axis X of coordinates which set the end portion of the shielding layer as the 0 point (a base point). The position X is expressed by a value having minus (−). That is, the position of the edge of the bank shown in FIG. 11(b) falls within a region of X<0. Further, the greater the distance that the edge of the bank extends toward the left side in FIG. 11(b), the value of X is decreased.

Figure 12:
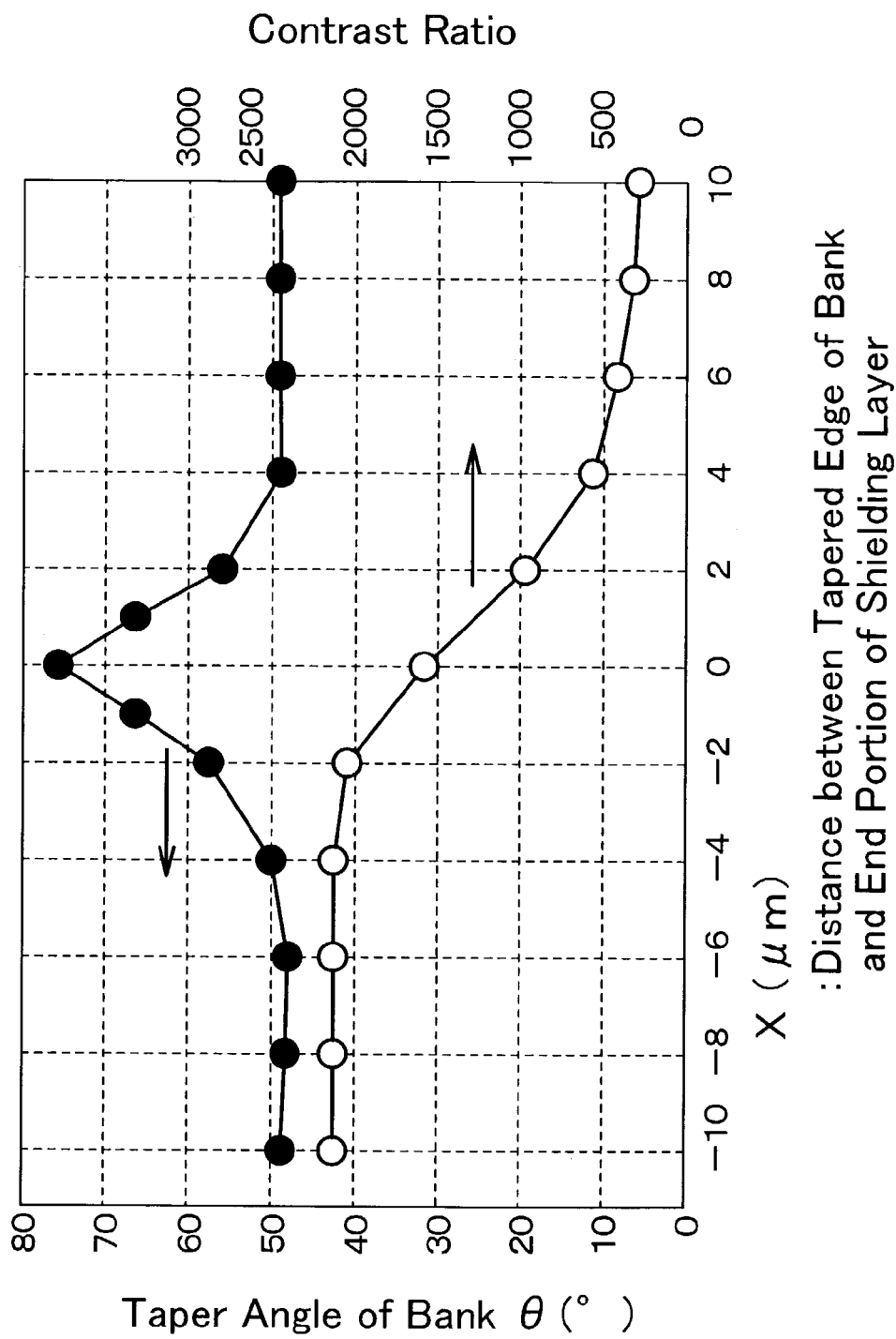
FIG. 12 shows both variations of a taper angle of bank and contrast ratio versus a distance between a tapered edge of the bank and an end portion of the shielding layer.

The inventors have investigated the change of taper angle made by the oblique surface of the bank opening and the main surface of the transparent electrode (main surface of the substrate) and the change of contrast of an image displayed on the pixel array with respect to the above-mentioned distance X (μm) between the end portion of the shielding layer and the edge of the bank defined along the axis X of coordinates and the result of the investigation is shown in FIG. 12. In FIG. 12, black dots indicate the above-mentioned taper angle and white dots indicate the display contrast of the pixel array respectively. The taper angle θ of the bank is increased in the vicinity of X=0 where the edge of the bank is overlapped to the end portion of the shielding layer. When the taper angle θ of the bank approaches 90°, the electrode (electrode CM shown in FIG. 8 and FIG. 9) which is formed such that the electrode extends from the upper surface of the bank to the inside of the opening of the bank is liable to be cut due to a stepped portion formed in the edge of the bank opening.

When the electrode is cut in such manner at the stepped portion formed in the pixel, such an impurity as moisture or oxygen easily gets into the organic material layer from outside through a break of the electrode and deteriorates reliability of the organic EL element. As FIG. 12 shows, when the above-mentioned distance X lies in a range of ±1 μm, the taper angle θ of the bank becomes larger than c.a. 65 so that the stepped portion of the electrode can be easily formed. Such inclination of the electrode to form the stepped portion thereof in accordance with the taper angle θ of the bank is basically common to a bank formed of an inorganic material.

On the other hand, as the taper angle θ of the bank approaches closer to 90°, leaking of light from the light emitting layer of the neighboring pixel is hardly generated so that the contrast of the image displayed on the pixel array is enhanced. The contrast ratio which is one of the indices for evaluating the image quality exhibits the tendency that it is generally worsened when the distance X is increased. This tendency is attributed to a phenomenon that when the distance X is increased, the light shielding of the channel region of the switching element becomes insufficient. From a practical point of view, the positional relationship among the light emitting layer, the shielding layer and the channel region of the transistor is important for improving the contrast ratio. In this respect, as described in the above-mentioned embodiment, it is preferable to arrange the shielding layer to a position where at least light from the light emitting layer in the vicinity of the edge of the bank layer is not directly irradiated to the channel region. Further, the factor that the contrast ratio is largely enhanced when the distance X is made small is irrelevant to the taper angle of the edge of the bank and rather lies in that the reflection light at the edge of the bank is obstructed and is not irradiated from the pixel array.

To arrange the above-mentioned principles, the present invention can be grasped as a single form or a combination of following constitutions.

(1) The shielding layer is arranged at the position where light from the light emitting layer of the pixel on which the shielding layer is formed is not directly irradiated to the channel region of the switching element which controls the pixel or another pixel which is disposed close to the pixel.

(2) At least one of the scanning signal line, the data signal line (drain line) and the current supply line which are arranged between the pixels arranged close to each other is configured to have a width which can prevent light from the light emitting layers of respective pixels from being reflected and leaked to the neighboring pixel or the arrangement or the interval of these components are adjusted so that they function as a shielding layer.

(3) In a plan view of the pixel, when the boundary between the edge of the bank and the light emitting layer is projected from the end portion of the shielding layer (the above-mentioned case in which X is set to X>0), to reduce leaking of light from the light emitting layer of the neighboring pixel, in addition to the above-mentioned constitution (1) or the above-mentioned constitution (2), the bank layer per se is blackened or the bank layer is formed of an inorganic film ($SiN_x$ and/or $SiO_2$) which permits film thickness thereof to be thinned. With respect to the latter bank layer, it is desirable to make the bank layer thin to prevent the rupture of the electrode layer formed thereon, wherein it is preferable to set the film thickness to a value which falls within a range of several tens nm to several hundreds nm, for example.

(4) The end portion of the shielding layer in the planar structure of the pixel is projected to the light emitting layer side from the boundary between the edge of the bank layer and the light emitting layer (the above-mentioned state in which X is set to X<0). In this case, the bank may be transparent or blackened, and may also be formed of an inorganic material.

Figure 13:
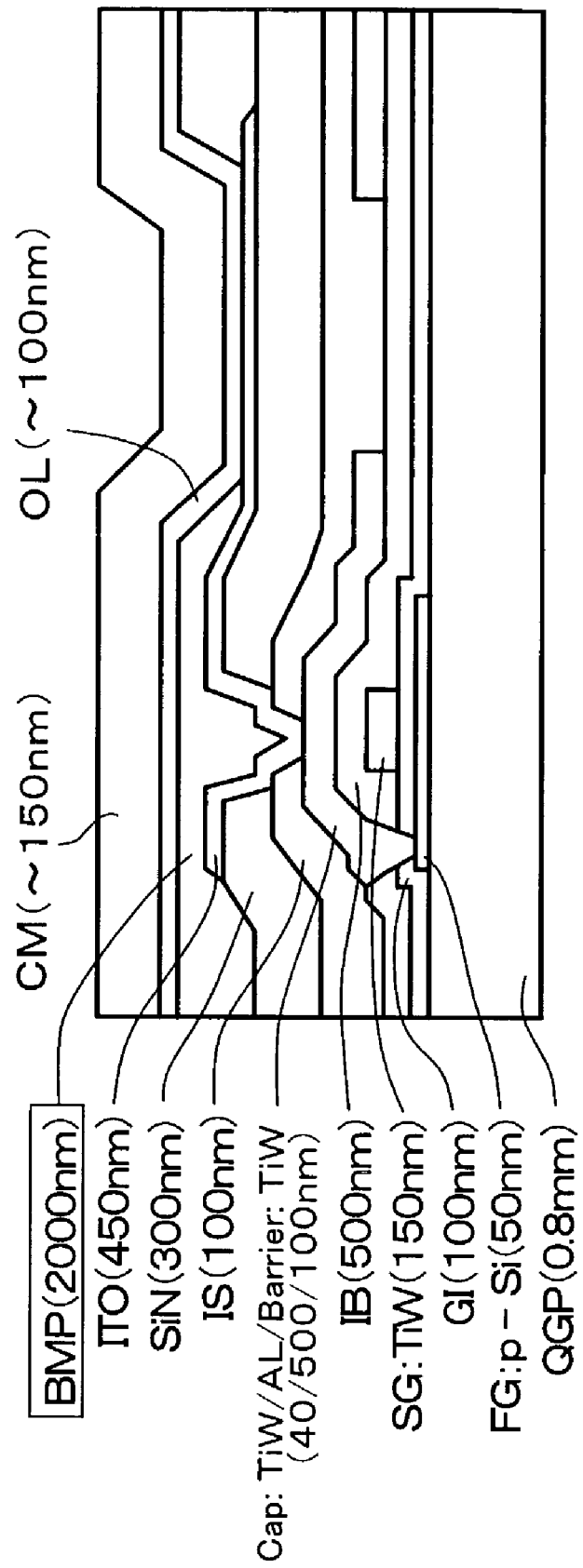
FIG. 13 shows one example of a cross-sectional structure in the vicinity of a pixel of the organic EL light emitting display device according to the present invention.

FIG. 13 shows the cross-sectional structure of the pixel of the organic EL light emitting display device to which the present invention is applied. The materials and the film thicknesses of respective thin films indicated in the cross-sectional view can be suitably changed. The relationship among the distance X (μm) between the end portion of the shielding layer and the edge of the bank shown in FIG. 12, the taper angle of the bank opening and the contrast of image is obtained by changing the shapes of the line which supplies the electric current outputted from the channel FG of the switching element to the transparent electrode ITO and the opening of the bank BMP in the organic EL light emitting display device having the cross-sectional structure shown in FIG. 13. In the cross-sectional structure shown in FIG. 13, although the film thickness of the bank BMP is set to 2000 nm, the film thickness differs corresponding to the material of the bank. In the cross-sectional structure shown in FIG. 13, on the main surface of the quartz substrate QGP, the channel FG made of polycrystalline silicon, the insulation film GI, the control electrode (gate) SG made of titanium-tungsten alloy (TiW), the insulation film IB, the above-mentioned line (conductive layer) having three-layered structure of a cap layer made of titanium-tungsten alloy (TiW)/aluminum (Al)/a barrier layer made of titanium-tungsten alloy (TiW), the insulation layer IS, SiN, the transparent electrode ITO, the bank BMP, the organic material film OL including the light emitting region, and the electrode layer CM are sequentially formed.

FIG. 14 shows display images in an experiment in which the contrast of the organic EL light emitting display device to which the present invention is applied and the contrast of the conventional organic EL light emitting display device are compared. In the experiment, respective display screens (pixel arrays) of a pixel array to which the present invention is applied and a pixel array to which the present invention is not applied are divided into 9 sections. Then, the comparison of the contrast under the ANSI Standard (the Standard defined by American National Standard Institute) in which black sections and white sections are alternately displayed (hereinafter referred to as "first comparison") and the comparison of contrast when respective whole display screens are displayed in black and white respectively (hereinafter referred to as "second comparison") are performed.

In the first comparison, the luminance A (ANSI white) of the center of the pixel array when the center of the pixel array is displayed in white and the luminance B (ANSI black) of the center of the pixel array when the center of the pixel array is displayed in black are measured and the ratio of luminance is calculated as the contrast ratio. With respect to the conventional pixel array to which the present invention is not applied, the luminance A is 180 $cd/m^2$ and the luminance B is 2.0 $cd/m^2$ and hence, the contrast ratio in the center portion of the pixel array is calculated as 90:1. To the contrary, with respect to the pixel array to which the present invention is applied, the luminance A is 200 $cd/m^2$ and the luminance B is 0.1 $cd/m^2$ and hence, the contrast ratio in the center portion of the pixel array is calculated as 2000:1.

In the second comparison, the luminance C of the center of the pixel array when the whole pixel array is displayed in white and the luminance D of the center of the pixel array when the whole pixel array is displayed in black are measured and the ratio of luminance is calculated as the contrast ratio. With respect to the conventional pixel array to which the present invention is not applied, the luminance C is 180 $cd/m^2$ and the luminance D is 0.12 $cd/m^2$ and hence, the contrast ratio in the center portion of the pixel array is calculated as 1500:1. To the contrary, with respect to the pixel array to which the present invention is applied, the luminance C is 200 $cd/m^2$ and the luminance D is 0.1 $cd/m^2$ and hence, the contrast ratio in the center portion of the pixel array is calculated as 2000:1.

In this manner, in the conventional organic EL light emitting display device which does not adopt the light shielding structure of the present invention, the contrast ratio which is calculated by displaying the whole screen in white and in black is 1500:1 and the so-called ANSI contrast ratio which is calculated when the white-and-black checkered pattern is displayed on the screen in an inverted manner is 90:1. As described above, in the screen which displays the white-and-black checkered pattern, the luminance B of the pixel to be displayed in black is not sufficiently lowered. Further, the contrast ratio is influenced by the display image depending on the display image.

To the contrary, with respect to the organic EL light emitting display device according to the present invention, the contrast ratio is largely enhanced to 2000:1 in both cases and the contrast ratio is not influenced by the display image. Further, in the screen which displays the white-and-black checkered pattern, the luminance B of the pixel to be displayed in black is sufficiently lowered so that a profile of an object to be displayed can be sharply displayed. Accordingly, in the organic EL light emitting display device according to the present invention, it is possible to remarkably enhance the image quality of the display image compared to the image quality of the display image of the conventional organic EL light emitting display device.

Figure 15:
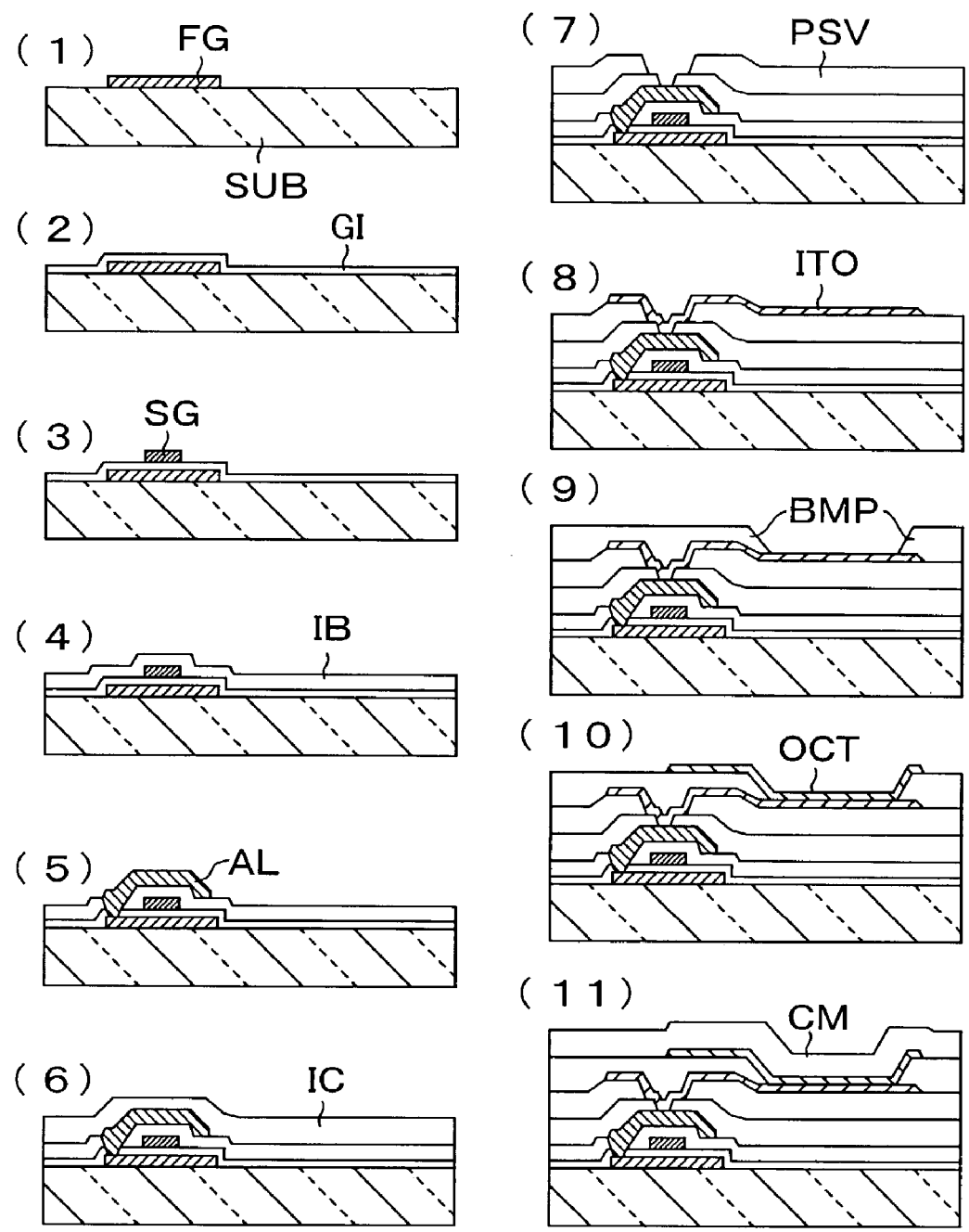
FIG. 15 is a view showing steps of manufacturing process of the organic EL light emitting display device according to the present invention while mainly focusing on a driver transistor (TFT portion)

FIG. 15 is a view showing steps of the manufacturing process of the organic EL light emitting display device to which the present invention is applied while focusing on the portion (TFT portion) where the drive transistor is mounted. Although the thin film transistor having a so-called top gate structure which mounts the control electrode on the channel as the drive transistor is used in this embodiment, even when the thin film transistor having a bottom gate structure is adopted in place of the thin film transistor having the top gate structure, the manufacturing process thereof is substantially equal to that of the thin film transistor having the top gate structure. The steps of the manufacturing process are explained hereinafter in the order of (1) to (10) in conformity with the respective numbers of cross-sectional views.

(1) The semiconductor layer FG made of amorphous silicon is formed on the glass substrate SUB by patterning and the semiconductor layer FG is formed into the polycrystalline silicon layer by applying laser annealing.

(2) The first insulation layer IA is formed on the semiconductor layer FG made of polycrystalline silicon.

(3) The conductive thin film made of titanium (Ti), tungsten (W) or the like is applied to the first insulation layer GT and the conductive thin film is subjected to patterning on the upper portion of the semiconductor layer FG thus forming the gate electrode GL.

(4) The second insulation layer IB is formed such that the second insulation layer IB covers the gate electrode GL and the first insulation layer GI and the contact holes are formed in necessary places.

(5) The aluminum line which constitutes the source electrode AL is formed on the second insulation layer IB (When necessary, this aluminum thin film is sandwiched by titanium (Ti) or tungsten (W) or the like.)

(6) The third insulation layer IC which covers the above-mentioned aluminum line AL is formed.

(7) The protective film PSV made of silicon nitride (SiN) or the like is formed on the third insulation layer IC. The contact hole which penetrates the protective film PSV and the third insulation layer IC and reaches the source electrode FG is formed.

(8) The thin film made of indium-tin-oxide (ITO) is applied to the protective film PSV thus forming the electrode ITO. In this manner, the first electrode layer ITO of the organic EL element is formed. A portion of the first electrode layer ITO is connected to the source electrode AL through the contact hole.

(9) The bank BMP for insulating the organic light emitting layer from the end portion of the first electrode ITO is formed. The opening is formed in the bank BMP at a position corresponding to the light emitting region. The bank BMP is formed of black polyimide having fluidity. The inner wall of the opening of the bank BMP which is formed in the light emitting region is formed in a tapered shape toward an upper surface of the first electrode layer ITO due to heat applied at the time of forming the pattern.

(10) The organic light emitting layer OCT is applied to the opening of the bank BMP in the light emitting region. The organic light emitting layer OCT is applied using a technique such as mask printing, an ink jet or the like.

(11) The metal layer is formed such that the metal layer covers the organic light emitting layer OCT thus forming the second electrode layer CM of the organic EL element.

After performing the above-mentioned steps, the second electrode layer CM side is sealed with the sealing can or a suitable member made of glass, ceramics or the like thus completing the display device as a module.

Figure 16:
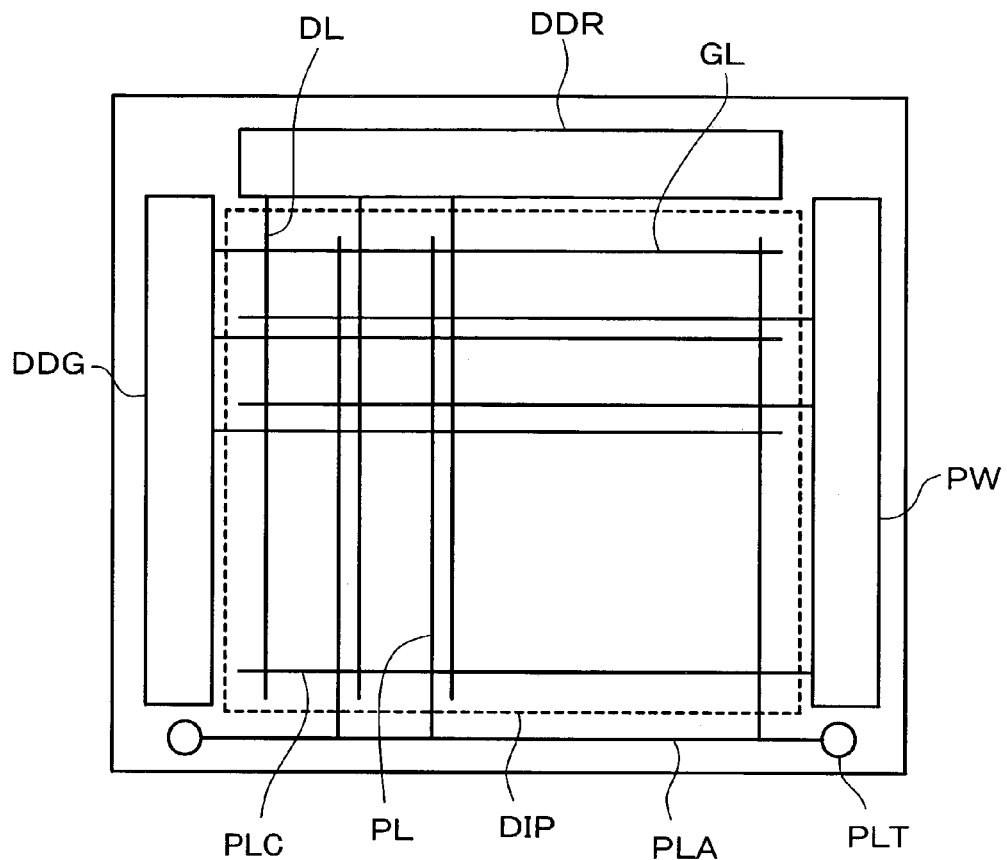
FIG. 16 is a view for explaining the arrangement of a group of lines of the organic EL light emitting display device according to the present invention.

FIG. 16 shows the arrangement of a group of lines of the organic EL light emitting display device to which the present invention is applied. The organic EL light emitting display device of the present invention is configured such that a display part DIP (region surrounded by a dotted line in FIG. 16) is formed by arranging a plurality of drain lines DL and a plurality of scanning signal lines (gate lines) GL in a matrix array on the quartz substrate QGP, and a data driving circuit DDR, a scanning driving circuit DDG and a current supply circuit PW are arranged in the periphery of the display part DIP.

The data driving circuit DDR is provided with a complementary circuit which includes TFTs (thin film transistors) having N-type channels and TFTs having P-type channels, a shifter register circuit which includes only TFTs having N-type channels or only TFTs having P-type channels, a level shifter circuit, an analogue switch circuit and the like. Here, the current supply circuit PW has only a bus line thereof formed on the quartz substrate QGP and an electric current may be supplied to the bus line from an external current source.

In the organic EL light emitting display device shown in FIG. 16, capacitors (not shown in the drawing) which adjust the operation of the drive transistors of respective pixels are arranged in the display part DIP and the current supply line PL to which one ends of respective capacitors are connected is provided for every column of pixels. Another ends of the above-mentioned capacitors are connected to a common current supply line PLC which is provided for every row of pixels. The current supply lines PL are connected to an external common potential source through a terminal PLT of a common potential bus line PLA.

Figure 17:
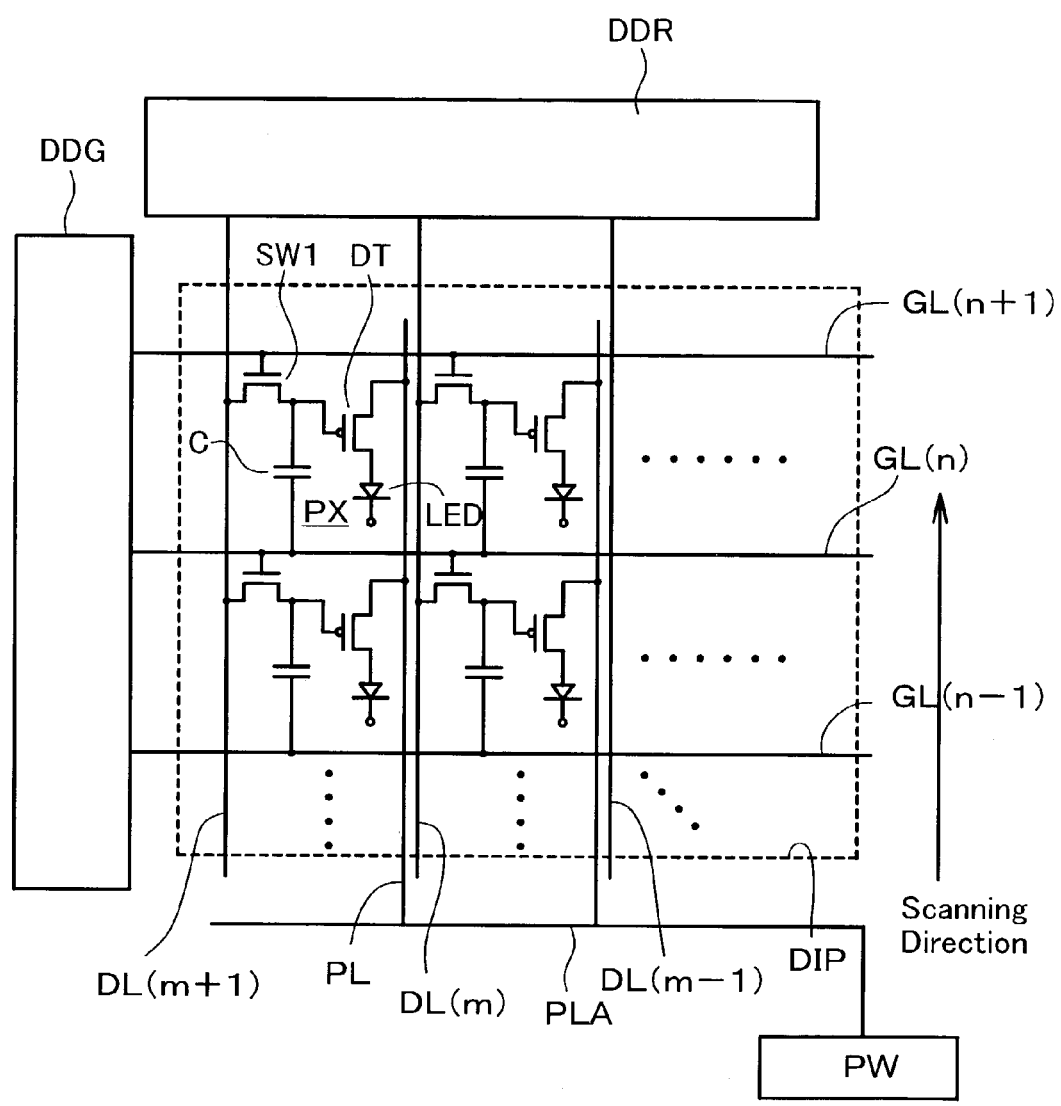
FIG. 17 is a view for explaining the circuit constitution of the organic EL light emitting display device according to the present invention.

FIG. 17 shows a circuit constitution of the organic EL light emitting display device to which the present invention is applied. As shown in FIG. 17, in each pixel PX which is surrounded by the data lines DL and the gate lines GL, the switching element (control transistor) SW1, the current supply transistor (drive transistor) DT, the capacitor C and the organic EL element LED are arranged. The switching element SW1 has the control electrode (gate) thereof connected to the gate line GL and one end of the channel (drain) connected to the data line DL. The gate of the current supply transistor DT is connected to the other end (source) of the switching element SW1 and one electrode (+ pole) of the capacitor C is connected to the node. The current supply transistor DT has one end (drain) of the channel thereof connected to the current supply line PL and another end (source) thereof connected to an anode of the organic EL element ELD. The data lines DL are driven by the data driving circuit DDR and the scanning signal lines (gate lines) GL are driven by the scanning driving circuit DDG. Further, the current supply lines PL are connected to the current supply circuit PW through the common potential supply bus line PLA.

In FIG. 17, when one pixel PX is selected through the scanning signal line GL and the switching element (control transistor) SW1 is turned on, the image signal supplied from the data line DL is stored in the capacitor C. Thereafter, at a point of time that the switching element SW1 is turned off, the current supply transistor DT is turned on so that the electric current flows into the organic EL element LED from the current supply line PL substantially for one frame period. The electric current which flows into the organic EL element LED is adjusted by the current supply transistor DT and the voltage corresponding to the charge stored in the capacitor C is applied to the gate of the current supply transistor DT. Accordingly, the emitting of light of the pixel is controlled. Although not shown in FIG. 17, the operation level of the capacitor C may be controlled based on the potential of the control signal lines CL1, CL2 shown in FIG. 1(A).

In the pixel structure shown in FIG. 1(A), since the control signal lines CL1, CL2 are formed such that these lines penetrate the portions of the pixel region, the area of the light emitting region is restricted. However, the provision of the control signal lines CL1, CL2 brings about an advantage that the operation of a plurality of current supply transistors DT arranged within the display screen can be adjusted so that the image can be produced on the display screen without being influenced by the irregularities of the characteristics of these current supply transistors DT.

FIG. 18 shows a so-called pixel circuit which is provided to one of a plurality of pixels PX shown in the above-mentioned FIG. 17. The pixel shown in FIG. 18 is surrounded by the drain line (data line) DL, the scanning signal lines GL(n+1), GL(n) and the current supply line PL.

In the pixel circuit shown in FIG. 18, one terminal of the capacitor C which is connected to the node between the one end (source) of the channel of the switching element (control transistor) SW1 and the control electrode (gate) of the current supply transistor DT constitutes a + pole and another end thereof which is connected to the scanning signal line GL(n) constitutes a (−) pole.

The organic EL element (organic light emitting element) LED has a so-called PIN-type diode structure in which an organic light emitting layer (not shown in the drawing) is interposed between the first electrode layer ITO (anode) and the second electrode layer (cathode) CM. Here, the first electrode layer ITO is connected to one end (source) of the channel of the current supply transistor DT and the second electrode layer CM is formed not only in the pixel shown in FIG. 18 but also in the whole pixel array region shown in FIG. 17 in which a plurality of pixels are arranged.

Here, a quantity of charge which corresponds to the image signal (also referred to as "video signal" or "data signal") supplied to the capacitor C from the drain line DL through the switching element SW1 is held. Accordingly, the charge held in the capacitor C also corresponds to the gray scale to be displayed by the pixel PX and hence, by controlling the current supply transistor (drive transistor) DT using the control voltage corresponding to the quantity of charge, the electric current corresponding to the gray scale flows into the organic light emitting element LED.

The organic light emitting element LED emits light with luminance substantially proportional to a quantity of current supplied to the organic light emitting element LED and with color corresponding to the organic light emitting material (electroluminescence material) which constitutes a light emitting layer formed on the organic light emitting element. In the organic EL light emitting display device which performs the color display, the organic light emitting layer materials which are used in the light emitting layer are changed corresponding to respective pixels of red, green and blue in many cases. Further, it may be possible to display the color image using the organic EL light emitting display device in which the light emitting layers of respective pixels are formed using the organic light emitting layer materials which irradiate so-called white light and these light emitting layers are combined with color filters which are similar to those used in the liquid crystal display device.

In all of the above-mentioned organic EL light emitting display devices, the video signals (data signals) can be transmitted in an analogue quantity or a time-division digital quantity. Further, it may be possible to combine an area gray-scale method which divides the light emitting area of respective pixels of red, green and blue to the gray scale control of the organic EL light emitting display device.

According to the present invention, in the organic EL light emitting display device which performs the image display by the active matrix driving (TFT driving), it is possible to prevent the degradation of image quality and the occurrence of the smear. Further, the contrast ratio and the luminance of the display image can be enhanced. Accordingly, it is possible to obtain the organic EL light emitting display device which can perform the high quality image display.

What is claimed is:

1. An organic light emitting display device, comprising:
a substrate SGP;
a plurality of drain lines DL;
a plurality of current supply lines PL;
a plurality of scanning signal lines GL formed on a layer lower than the a plurality of drain lines DL or the plurality of current supply lines PL; and
a plurality of pixels;
each of the pixels formed in accordance with an intersection between the drain line DL and the scanning signal line GL, comprising:
a lower electrodes ITO formed on the substrate;
an insulating film BMP formed on the lower electrode, the insulating film comprising an opening with an edge formed on the lower electrode;
an organic light emitting layer OCT formed inside of the opening and on the insulating film;
an upper electrode CM formed on an organic light emitting layer;
a first active switching element SW1 controlled by the scanning signal line; and
a second active element DT controlling a current flowing between of the lower electrode and the upper electrode, the lower electrode ITO being connected to the current supply line PL via the second active switching element,
wherein a first electrode C1 or C2 is formed under the current supply line PL, extends along the current supply line PL, and comprises titanium or tungsten, and
wherein a second electrode layer CSi is formed under the second electrode C1 or C2, extends along the second electrode C1 or C2, and comprises poly silicon.

2. An organic light emitting display device, according to claim 1:
wherein the drain line DL or the current supply line PL overlaps the first electrode C1 or C2.

3. An organic light emitting display device, according to claim 1:
wherein the electrode layer C1 or C2 overlaps the second electrode.

4. An organic light emitting display device, according to claim 3:
wherein a capacitance is constituted by the first electrode C1 or C2 and the second electrode.

5. An organic light emitting display device, according to claim 3:
wherein an edge of the insulating layer does not coincide or overlap an end portion of the first electrode C1 or C2.

6. An organic light emitting display device, according to claim 1:
wherein the lower electrode ITO is formed of an amorphous layer or a polycrystalline layer of a conductive oxide which allows a light to pass therethrough and is typically represented by an indium-tin oxide or an indium-zinc oxide.

7. An organic light emitting display device, according to claim 1:
wherein the insulating film comprises a black resin.

8. An organic, light emitting display device, according to claim 1:
wherein a taper angle made by the lower electrode ITO and an opening end portion of the insulating layer BMP formed on the transparent electrode ITO is approximately equal to or less than 50 degrees.

9. An organic light emitting display device, comprising:
a substrate SGP;
a lower electrode ITO formed over the substrate;
an insulating film formed on the lower electrode, comprising an opening with an edge formed on the lower electrode ITO;
an organic light emitting layer OCT formed inside the opening and over the insulating film;
an upper electrode formed on the organic light emitting layer OCT;
a drain line DL;

a current supply line PL;

a plurality of scanning signal lines GL formed on a layer lower than the a plurality of drain lines DL or the plurality of current supply lines PL; and a plurality of pixels;

each of the pixels formed in accordance with a cross section between the drain line DL and the scanning signal line GL, comprising:

a first active switching element SW1 controlled by the scanning signal line and a second active element DT controlling a current flowing between of the lower electrode and the upper electrode, wherein the first active element and the second active element are top gate type TETs, wherein a first electrode C1 or C2 extends along the current supply line PL, and is formed in the same layer as the scanning signal line so as to shield a light from a neighboring pixel in a column direction, wherein a second electrode layer CSi expends along the current supply line PL, is formed under the current supply line PL, and comprises poly silicon.

10. An organic light emitting display device, according to claim 9:

wherein the drain line DL or the current supply line PL overlaps the first electrode C1 or C2.

11. An organic light emitting display device, according to claim 9:

wherein the electrode layer C1 or C2 overlaps the second electrode.

12. An organic light emitting display device, according to claim 11:

wherein a capacitance is constituted by the first electrode C1 or C2 and the second electrode.

13. An organic light emitting display device, according to claim 11:

wherein an edge of the insulating layer does not coincide or overlap an end portion of the first electrode C1 or C2.

14. An organic light emitting display device, according to claim 9:

wherein said lower electrode ITO is formed of an amorphous layer or a polycrystalline layer of a conductive oxide which allows light to pass therethrough and is typically represented by an indium-tin oxide or an indium-zinc oxide.

15. An organic light emitting display device, according to claim 9:

wherein the insulating film comprises a black resin.

16. An organic light emitting display device, according to claim 9:

wherein a taper angle made by the lower electrode ITO and an opening end portion of the insulating layer BMP formed on the transparent electrode ITO is approximately equal to or less than 50 degrees.

* * * * *